United States Patent
Bernardin et al.

(10) Patent No.: US 10,897,839 B2
(45) Date of Patent: Jan. 19, 2021

(54) COMPUTER SERVER ASSEMBLY

(71) Applicants: Michel Bernardin, Elberton, GA (US); Arch Davis, Elberton, GA (US); Joseph Chrzempiec, Elberton, GA (US); Benjamin Esposti, Elberton, GA (US)

(72) Inventors: Michel Bernardin, Elberton, GA (US); Arch Davis, Elberton, GA (US); Joseph Chrzempiec, Elberton, GA (US); Benjamin Esposti, Elberton, GA (US)

(*) Notice: Subject to any disclaimer, the term of this patent is extended or adjusted under 35 U.S.C. 154(b) by 348 days.

(21) Appl. No.: 15/935,825

(22) Filed: Mar. 26, 2018

(65) Prior Publication Data

US 2019/0297749 A1 Sep. 26, 2019

(51) Int. Cl.
*H05K 7/20* (2006.01)
*H05K 7/14* (2006.01)
*G06F 1/3296* (2019.01)

(52) U.S. Cl.
CPC ....... *H05K 7/20836* (2013.01); *G06F 1/3296* (2013.01); *H05K 7/1492* (2013.01); *H05K 7/20727* (2013.01)

(58) Field of Classification Search
CPC .......... H05K 7/14; H05K 7/20; H05K 7/1492; H05K 7/20836; H05K 7/20209; G06F 1/32; G06F 1/184–187; G08B 13/19647; G08B 25/14
USPC ................ 361/679, 788, 796–802
See application file for complete search history.

(56) References Cited

U.S. PATENT DOCUMENTS

| | | | | |
|---|---|---|---|---|
| 6,101,459 A | * | 8/2000 | Tavallaei | H05K 7/20836 702/130 |
| 6,198,642 B1 | * | 3/2001 | Kociecki | H02M 1/4225 307/150 |
| 6,523,112 B1 | * | 2/2003 | Gallagher | G06F 1/18 713/1 |
| 7,696,872 B2 | * | 4/2010 | Burwell | G08B 25/14 340/539.31 |
| 9,800,087 B2 | * | 10/2017 | Kouroussis | G06F 1/3206 |
| 10,231,361 B2 | * | 3/2019 | Chen | F04D 25/0613 |
| 2003/0081128 A1 | * | 5/2003 | Kirmuss | G08B 13/19647 348/207.99 |
| 2004/0057203 A1 | * | 3/2004 | Rabinovitz | G06F 1/184 361/679.31 |

(Continued)

*Primary Examiner* — Tuan T Dinh
(74) *Attorney, Agent, or Firm* — Southeast IP Group, LLC; Thomas L. Moses

(57) ABSTRACT

An improved computer server that generates less heat, requires less energy to operate, and is capable of operating in much higher temperatures includes a power conversion assembly that receives standard 110 volt or other voltage AC power and converts it to unregulated 48 volt DC current externally. Then the 48 volt current is fed into the internal power train, and converts that current to lower voltages for use by various components within the server. Additionally, the size and shape of the server housing allows for more efficient heat transfer, wherein the housing, in a preferred embodiment, has a lateral cross-section with dimensions of between 3.5 inches to 8 inches of width and 3.5 inches to 7 inches of height. The server also may include heat and humidity sensors within the server housing, and these sensors are operationally connected to the fan used for cooling the server.

11 Claims, 33 Drawing Sheets

(56) References Cited

U.S. PATENT DOCUMENTS

| | | | |
|---|---|---|---|
| 2010/0110626 A1* | 5/2010 | Schmitt | H05K 7/1497 361/679.47 |
| 2010/0264733 A1* | 10/2010 | Arimilli | H02J 1/001 307/31 |
| 2011/0090633 A1* | 4/2011 | Rabinovitz | G06F 1/187 361/679.31 |
| 2014/0293523 A1* | 10/2014 | Jau | H05K 7/1487 361/679.4 |
| 2014/0362521 A1* | 12/2014 | Pronozuk | G11B 33/142 361/679.47 |
| 2016/0146223 A1* | 5/2016 | Cao | F04D 29/601 415/1 |
| 2016/0255421 A1* | 9/2016 | Farrar | G07C 9/00563 340/870.07 |
| 2017/0220505 A1* | 8/2017 | Breakstone | G06F 13/16 |

\* cited by examiner

COMPUTER SERVER ASSEMBLY

FIELD OF THE INVENTION

The present invention relates generally to computers and computer servers. More specifically, the present invention relates to computer servers having a novel power train and component arrangement that provides for more robust and reliable operations in higher temperatures, increased energy efficiency, and decreased power consumption.

BACKGROUND OF THE INVENTION

In recent years, large corporations such as Facebook, Google and Apple have built and begun using "server farms," which are large buildings and structures that are used to house hundreds, if not thousands, of servers that are all in simultaneous operation. These server farms (also referred to as "data centers" herein) have enormous power consumption requirements, due in part to the power required to run the servers themselves, and also largely due to the cooling systems that must be implemented and used in order to keep the temperatures and humidity within acceptable parameters inside the building. Traditional data centers, or server farms, must be cooled to low temperatures in order to prevent the servers from overheating. It is not unusual for such data centers to keep temperatures between 55 and 70 degrees Fahrenheit during normal operations. Not only are the climate control systems forced to overcome potentially hot temperatures outside the building, but the servers themselves generate an enormous amount of heat that must be transferred away from the inside of the building in order to maintain servers at temperatures that fall within normal operating parameters. Smaller collections of servers down to a single server in the closet of a small business also have heat dissipation and temperature issues.

Therefore, providing a server that is considerably more energy efficient and generates less heat, which may operate at higher temperatures, and which obviates the need for extensive and expensive climate control systems would be extremely advantageous and more cost effective that those currently on the market.

BRIEF SUMMARY OF THE INVENTION

In accordance with one aspect of the invention, a first embodiment of an improved computer server includes a power conversion assembly that receives standard 110 volt or other voltage AC power and converts it to unregulated 48 volt DC current externally (although it should be understood that other input voltages may be used, including 24V, 70V, 115V, 380V, or other desired voltages). Then the 48 volt current is fed into the internal power train, and converts that current to 12 volt and 5 volt (possibly along with other low-voltage currents, as necessary) for use by various components within the server. Advantageously, the conversion from standard AC power to DC power takes place outside of the server housing, which reduces the heat generated within the server itself during normal operation.

Additionally, the size and shape of the server housing allow for more efficient heat transfer, wherein the housing, in a preferred embodiment, has a lateral cross-section with dimensions of between 3.5 inches to 8 inches of width and 3.5 inches to 7 inches of height. The longitudinal length of the casing can vary, as desired. This novel geometry of the casing, along with the arrangement of components within the casing, creates a more efficient air flow through the internal portions of the casing, so that the fan power necessary to create an air pressure differential of 0.05 inches of water or less is significantly less than the fan power used to create the higher pressure differential required in standard servers that are available today.

The geometry of the housing also provides room to use larger heat sinks within the server than in 1U or 2U servers, including heat sinks that are greater than 2 inches tall. Large heat sinks are more efficient at transferring heat from the internal components in the server housing.

The server also includes, in one embodiment, heat and humidity sensors within the server housing, and these sensors are operationally connected to the fans used for cooling the server. If the sensors sense that the heat level is higher than it should be, then it adjusts the operation of the fans accordingly. Additionally, if the humidity levels are too high, then the system may slow the fans down or cut them off in order to dissipate the humidity more quickly.

These components and their physical and geometrical arrangement serve to provide a server that generates less heat, requires less energy to operate, and allows the server to operate in much higher temperatures and in otherwise dangerously high humidity levels than servers commonly found on the market today.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE INVENTION

Figure 1:
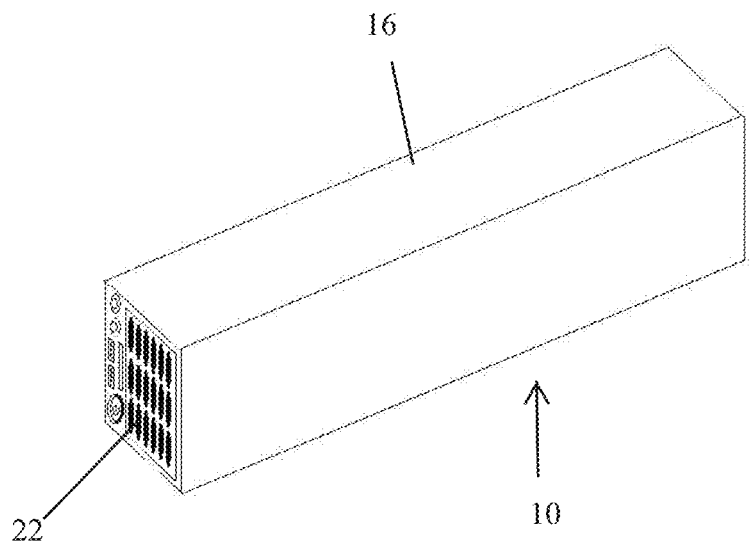
FIG. 1 is a perspective view of one embodiment of the present invention showing a computer server.

The present invention includes, in a first embodiment, a computer server 10 including a motherboard 12, a power and control board (P&CB) 14, a front panel board and other cables and circuitry within a metal casing or housing 16.

System Power and Control

In the preferred embodiment, the server uses an off-the-shelf motherboard which is sold as for use in computer servers. Therein, additional circuitry and software is required to provide the power, control and monitoring capabilities of this unique server invention.

The additional circuitry is implemented on a printed circuit board, which is referred to as the Power & Control Board (herein referred to as "P&CB," not to be confused with the standard abbreviation for printed circuit board or "PCB"). The P&CB is mounted within the server enclosure, along with the relevant switches, graphical display, indicator lights, and Ethernet connection. All of these elements provide interfaces in which the end-user can control the power state of the server, and also monitor feedback regarding the server status. Such feedback information includes, but is not limited to, power consumption, temperature, humidity, ON/OFF status, fan operational status and data logs.

Power & Control Board

The P&CB 14 contains a microprocessor that controls various operations, power converters, sense circuitry and other electronics. It receives unregulated 48 Volt power and converts it to lower and regulated voltages for operation of the P&CB and the motherboard. The P&CB 14 essentially gathers data from components such as the motherboard 12, temperature sensors 18 and fans. The P&CB then reports that data via a local display, and changes system operational status based on its interpretation of the environment by using built-in algorithms and human-initiated commands. This information is also available remotely to data center operational persons, who can also control functions of the server via this communication link. The server 10 is designed to operate on an unregulated power source of 48-volt direct current (48 VDC nominal). This input power flows through the P&CB 14, gets filtered of unwanted noise, and then is regulated to a steady voltage, after which it is fed to the mother board 12. This arrangement allows the voltage going to the mother board 12 to be fully controlled by the P&CB 14.

The main function of the P&CB 14 is to provide power control, data logging, and protection for itself and the rest of the server components against high temperature and humidity. For example, one of the algorithms programmed into the P&CB 14, in a preferred embodiment, acts to increase fan power when temperatures rise, decreases fan power for energy saving when intake temperature is low, and turns off fans for self heating when humidity is too high. The P&CB 14 reads and interprets environmental data, and then sends varying Pulse-Wave-Modulation (PWM) signals to the attached fan 20 (or fans). It may also detect fan failure, and in such a case may increase power to a second fan 20 in the housing 16 to compensate.

The PC&B 14 may receive commands from a remote or local human operator to reset, power down, power up, start up and shut down the processors in the motherboard 12. In one embodiment, the PC&B 14 may include a display and a knob to control a scroll-through menu. Other interfaces may be used to directly operate the P&CB 14, as desired. This arrangement provides reliable means to change state for clearing server software hangs, rebooting for another customer as in a cloud data center, or for saving energy.

On the P&CB 14, one of the functions that the microprocessor controls is a 48V switch. This design allows complete power cycling in case of software or hardware hangs of the motherboard 12. The P&CB 14 also includes remote control of the power-on and reset buttons of the motherboard 12.

Figure 8:
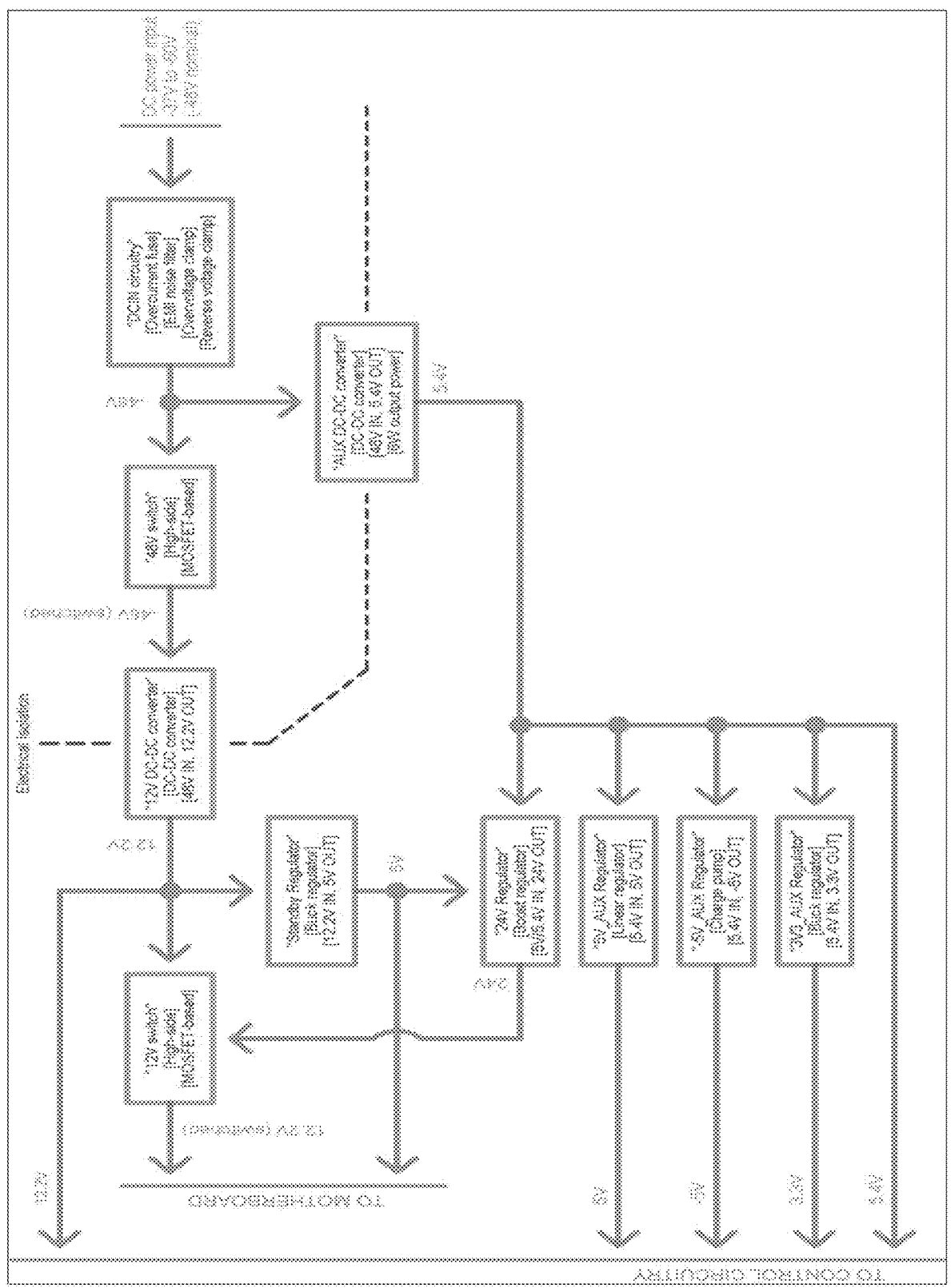
FIG. 8 is a schematic drawing of one embodiment of the present invention, showing a main control processor that controls all functions of the Power and Control Board (P&CB)

The P&CB 14 uses an "IOT" (embedded) processor for sensing and controlling the server. Multiple layers of encryption are employed for the connections to the outside world, but even should the P&CB 14 be hacked, the mother board 12, memory and storage are preferably independent of the P&CB 14. The main control processor that controls all functions of the P&CB is shown in FIG. 8, and it operates at 48 MHz, with a 3.3V power supply (3V3_AUX). The speed of 48 MHz is preferred as a compromise between faster processors that require more power, and slower processors that may have inadequate performance, although it is understood that faster or slower processors may be used.

The P&CB 14 implements a high-side, N-channel MOSFET-based load switch for the motherboard's 12V power supply. This design allows the P&CB to behave like a typical computer power supply. It can supply a constant standby voltage of 5V, while the 12V is only supplied upon request, via the active-low PS-ON wire.

Additional Circuitry

System-wise, the additional circuitry can be broken down into two major parts: the Power Train and the Control Circuitry. The following sections explain these two parts.

Power Train

The purpose of the Power Train is to regulate and control the flow of power within the server. It can turn the power to the motherboard on and off, and filters the voltage to make sure there is not much electrical interference or radiated emissions.

Figure 9:
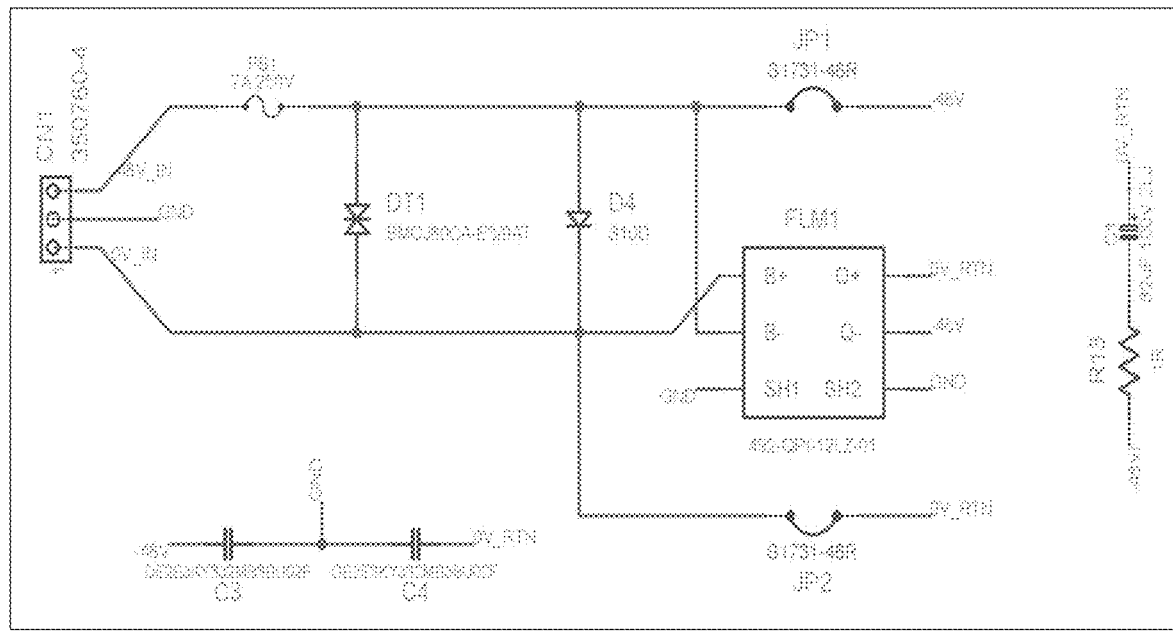
FIG. 9 is a schematic drawing of one embodiment of the present invention, showing circuitry for a power train that is positioned on a Power and Control Board.

In one preferred embodiment, power is supplied to the server 10 via a −48V DC source, and is fed through an EMI filter/plug module on the rear of the server 10. From there, the power goes to the P&CB 14, where it is filtered again and then converted to the various required supply voltages. The P&CB 14 side of this circuitry is shown in FIG. 9.

JP1 and JP2 are SMD jumpers, meant for bypassing the P&CB DC power input EMI filter, FLM1 (as necessary). DT1 provides surge protection, and D4 provides reverse polarity protection without dissipating energy during normal operation. This arrangement is more energy efficient than the use of a series diode in the circuit, but is used at the cost of blowing the fuse when polarity has been applied incorrectly, or in reverse. C3 and C93 are EMI suppression capacitors, of the Y safety type. R13 is required to keep the main DC-DC converter stable if a low-ESR electrolytic capacitor C1 is in-circuit. FS1 is the main current limiting element in the server. It is rated for 7 A at 250V, and should be of a ceramic type (3AB) for high fault current interruption capability.

In a preferred embodiment, the power circuitry includes a DC to DC converter and associated noise filtering, conditioning and switching circuitry. The server is designed to operate on 48 VDC (nominal, unregulated). This input power flows through the P&CB 14 which then connects to the mother board 12. This arrangement allows the voltage going to the mother board 12 to be fully controlled by the P&CB 14.

Using this 48V distribution scheme helps to enable high temperature operation since "silver box" power supplies, which are found in most current generation servers are hard to cool. The main 12 VDC power supply, an isolated DC-DC converter 30, takes a minimum of about 4.5 W when powered. In order to save energy when the server 10 is completely powered down, the input of this power supply is preferably disconnected from the power source. The −48V return high-side switch performs this duty.

In one embodiment, a chip called the LT4256, available from Linear Technology, controls the high-side MOSFET. In addition to being an on/off switch, it also has under-voltage (UV) protection. The UV protection pin functions as follows:

1. As the power source's voltage reaches about 39.5V, the UV pin on IC 6 reaches 4V. This makes IC 6 turn MOSFET Q3 ON.
2. If, for whatever reason, the power source's voltage drops below 35.6V, (3.6V on the UV pin) IC 6 turns Q3 OFF.
3. In order to use IC 6 and Q3 as a basic on/off switch, one only has to pull the UV pin LOW. This step turns the output OFF by effectively tricking IC 6 into detecting an under-voltage condition. The part that pulls the UV pin LOW is IC 7, an optocoupler.

Normally, the system control microprocessor (located elsewhere on the P&CB) handles the turning ON and OFF of the 12V power supply. The switch connected to CN9 also can control the power state of the 12V power supply, and has an internal LED indicator to show when the 12V power supply is outputting power.

By design in a preferred embodiment, if the AUX power supply fails, the 12V power supply remains ON (but note that it will turn ON if it was previously OFF). Also, if the system control processor needs to reset, doing so will not change the ON/OFF state of the 12V power supply because the toggle flip-flop circuit—comprised of IC 34—holds the desired ON/OFF state. The XOR gate IC 8 allows either the system control processor or the hard power switch to change the 12V power supply ON/OFF state. Additional fail-safe circuitry also sets the cooling fans to maximum power if the control microprocessor fails to output brief "heartbeat" pulses for more than [approximately] one second.

In some cases, server farms or data centers may charge customers based on the amount of electricity used over a unit of time, as a business model to effectively collect rent. This process is called submetering, wherein each server is monitored to determine the power consumption rates, and those rates are used for billing purposes for customers. In one preferred embodiment, metering circuitry is integrated into the P&CB in order to measure power consumption of that specific computer server, and that information may be used as the basis for charging customers for daily, weekly or monthly usage. Within the power train herein described, circuitry to measure DC voltage and current may be included. In a preferred embodiment, components (resistors, operational amplifiers, isolated power supplies, and analog to digital converters) are specified to a precision so that the overall measurements can be made within 0.2%. This is defined as "revenue grade" by standards bodies and is suitable for submetering to customers. Having precise information about the actual energy consumption of a server over time is valuable for billing and for a number of administrative decisions. Some of the more subtle uses include monitoring machines that are idle. It can help in identifying "zombie" servers and also "cloud" servers that are in transit from one rental customer to another. A remote control feature of the design can then be used to power-down these servers until they are needed again, thus providing additional energy efficiency by shutting down idle servers.

FIG. 8 depicts the overall diagram of the Power Train, specifically, where and how the electrical power flows. For simplicity, some items are left out of this diagram, mainly because they are related to the control circuitry that monitors the voltages and power states.

Almost all of the Power Train parts are located on the P&CB. The exception is the DC-inlet EMI filter module, which also serves as a robust connector through which the server's power is provided. This is where the power flows into the server. The voltage at this input can range from −37V to −60V. It is nominally −48V, and is referred to as such.

After the −48V current is filtered at the DC-inlet, the current is fed to the P&CB, where it first flows through a fuse FS1 (FIG. 9), then through either another EMI filter FLM1 (FIG. 9), or a set of jumpers JP1 and JP2 (FIG. 9). The fuse is a ceramic cartridge fuse that has a high current interrupting rating. There is a reverse-polarity protection diode D4 (FIG. 9) which will conduct and cause the fuse FS1 to blow if the −48V current is accidentally reversed, thus protecting the Power Train and other components on the P&CB. In addition, a transient voltage suppression diode ("TVS" diode) DT1 protects the Power Train and other components from brief spikes of excess voltage from the DC-inlet. Capacitor C1 (FIG. 9) and resistor R13 (FIG. 9) form a filter which smoothes the electrical current that is coming into the server. R13's purpose is to ensure the 12V DC-DC converter operates in a stable manner. When power is first applied to the DC-inlet, a brief surge of current up to approximately fifty to sixty amps flows through R13 in order to charge up capacitor C1. Ensure that R13 is rated to handle this pulse of current, otherwise it will be damaged.

Capacitors C3 and C4 (FIG. 9) provide additional electrical noise filtering.

Figure 10:
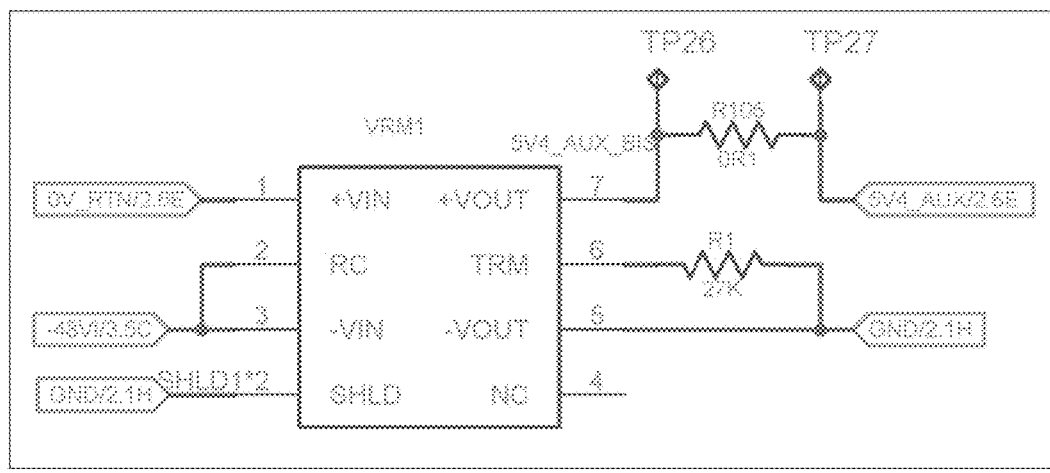
FIG. 10 is a schematic drawing of one embodiment of the present invention, showing Power and Control Board circuitry for controlling the fans, in order to reduce temperature and humidity within the computer server housing
Figure 11:
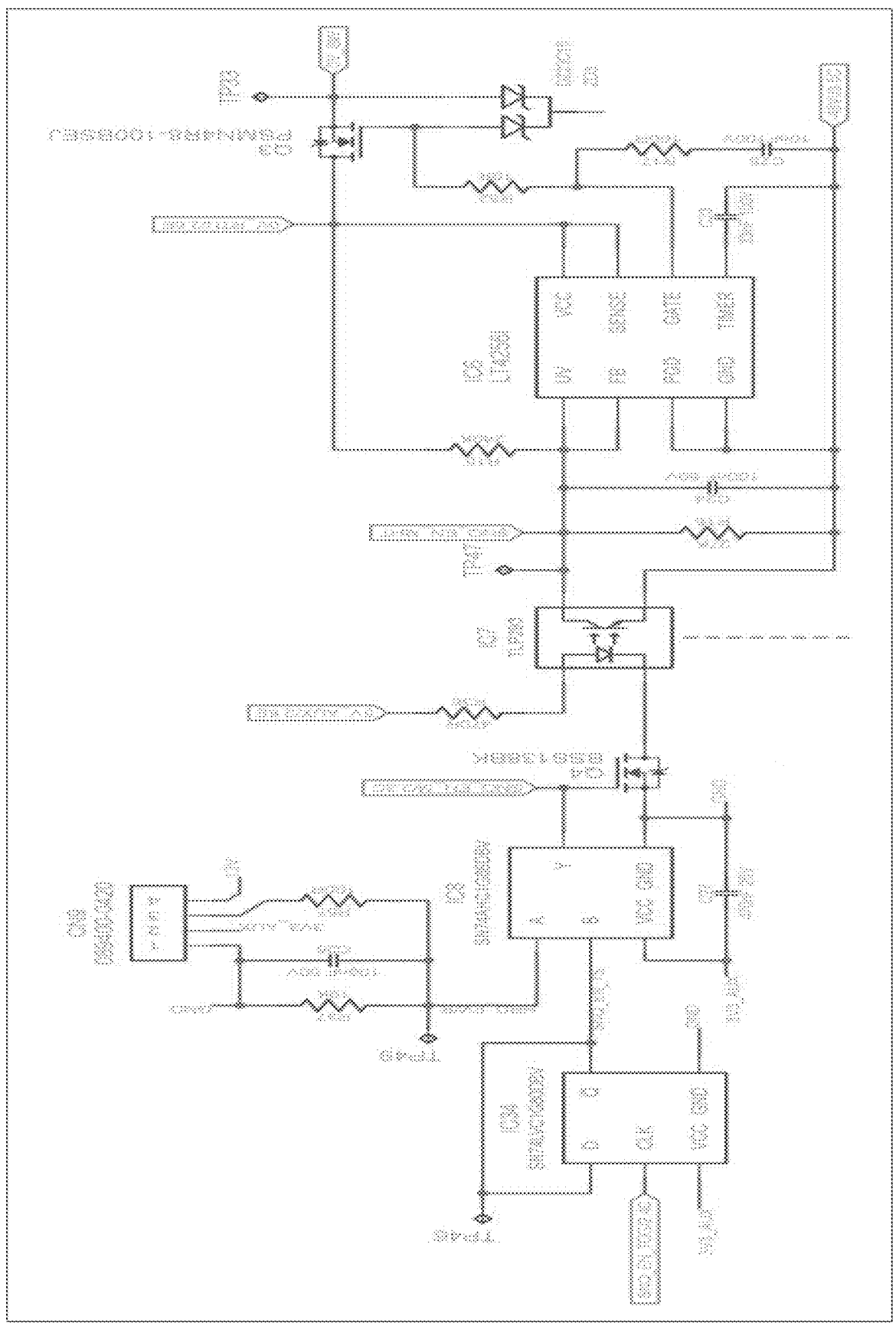
FIG. 11 is a schematic drawing of one embodiment of the present invention, showing a circuit diagram for two CPU temperature sensing inputs that are provided on the P&CB for the purpose of providing an independent temperature reading from the processor-on-motherboard reading.
Figure 12:
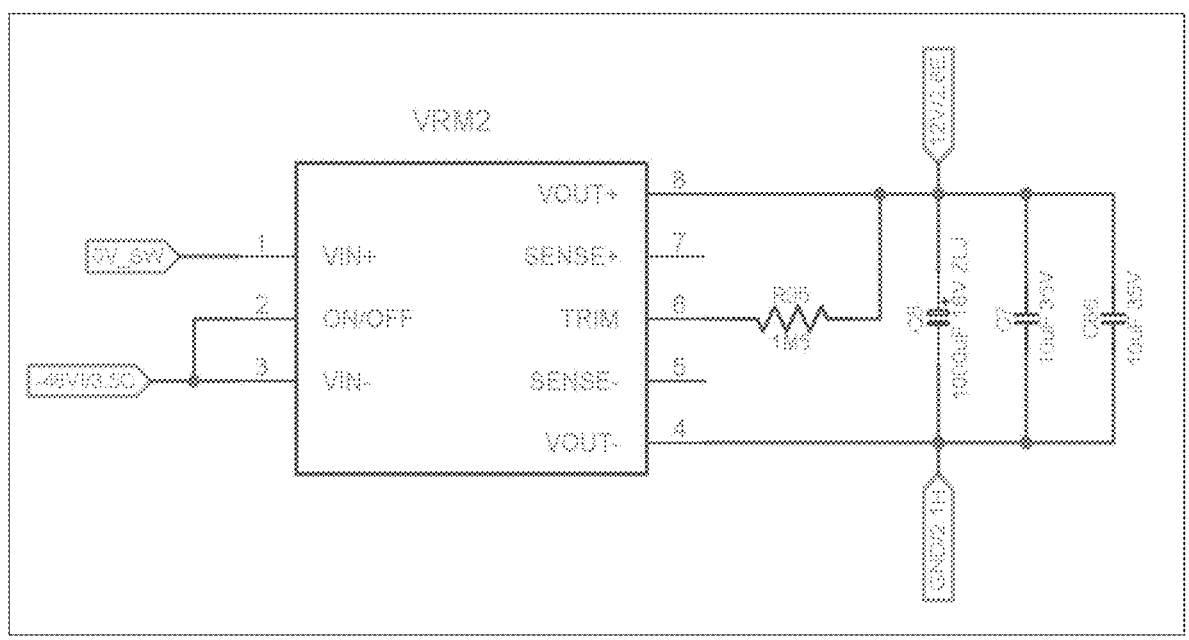
FIG. 12 shows one embodiment of main −48V to 12V converter.

Further on, the filtered −48V is fed to the auxiliary DC-DC converter VRM1 (FIG. 8 "AUX DC-DC converter"), and the solid-state switch (FIG. 8 "48V switch") which powers the main 12V DC-DC converter VRM2 (FIG. 8 "12 V DC-DC converter"). The auxiliary converter is there to power the control circuitry regardless of the output status from the main converter. These elements are shown in FIGS. 10, 11 and 12, respectively.

Once the power has been transferred through VRM1 and VRM2, it is fed to a multitude of different circuits. The 12V is fed to a buck converter (Figure xxx, "5V_STBY regulator") and a solid-state switch (FIG. 8 "12V switch"). The 5V_STBY regulator regulates a steady 5V for the motherboard standby power and for other circuits on the P&CB, while the 12V switch is used to turn the motherboard's 12V supply on and off.

Figure 13:
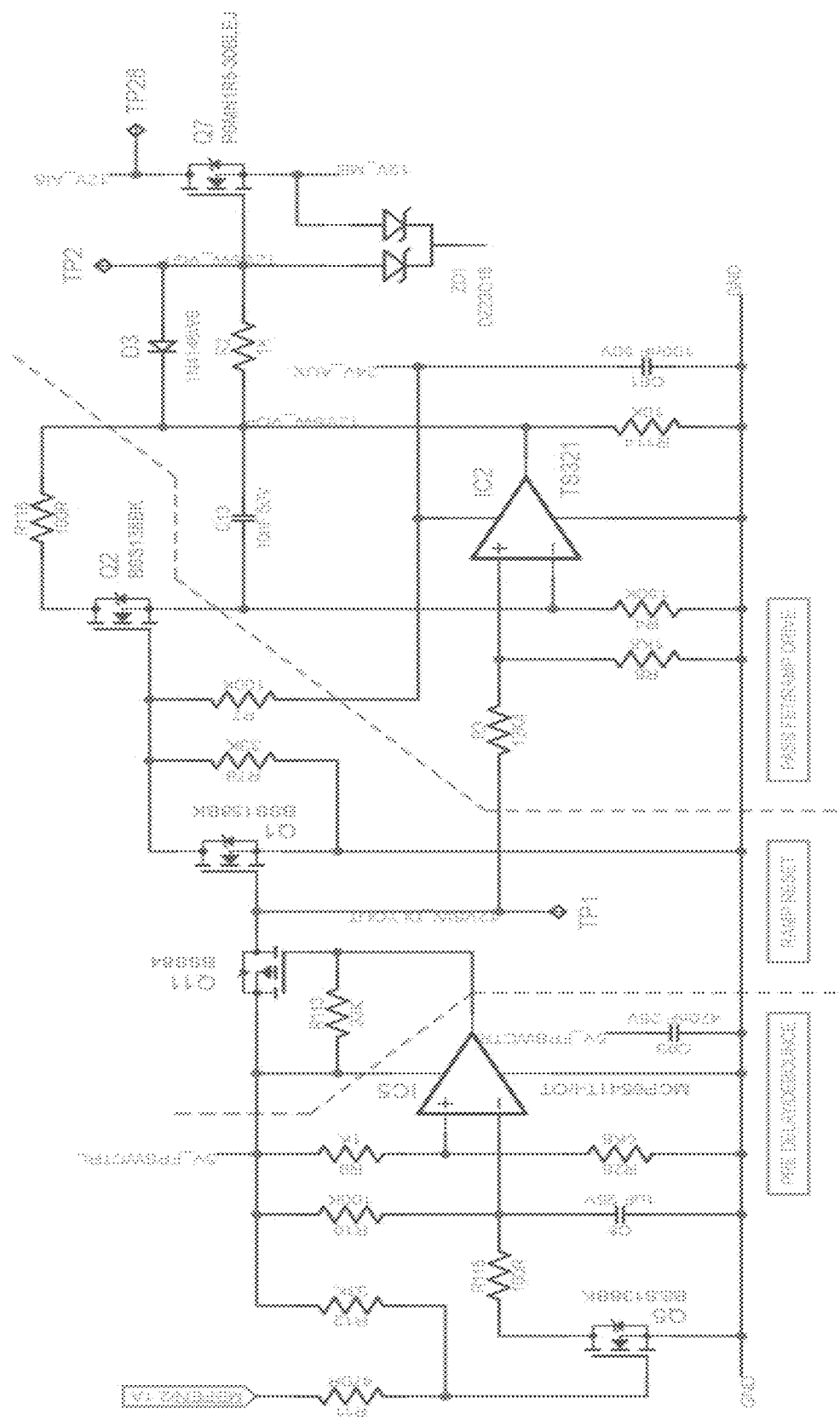
FIG. 13 shows one embodiment of a detailed circuit diagram for the 12V switch circuit.

In addition to turning on and off the 12V power to the motherboard, the 12 V switch acts as a soft-start to prevent the 12V DC-DC converter from being momentarily overloaded. The detailed circuit diagram for the 12V switch circuit is shown in FIG. 13. Comparator IC 5 is used as a debouncing circuit to prevent erroneous activation of the 12V switch. A few transistors and resistors form the ramp reset circuit, which resets the MOSFET-driving linear-ramp circuit (made of op-amp IC 2) to the OFF state.

Figure 14:
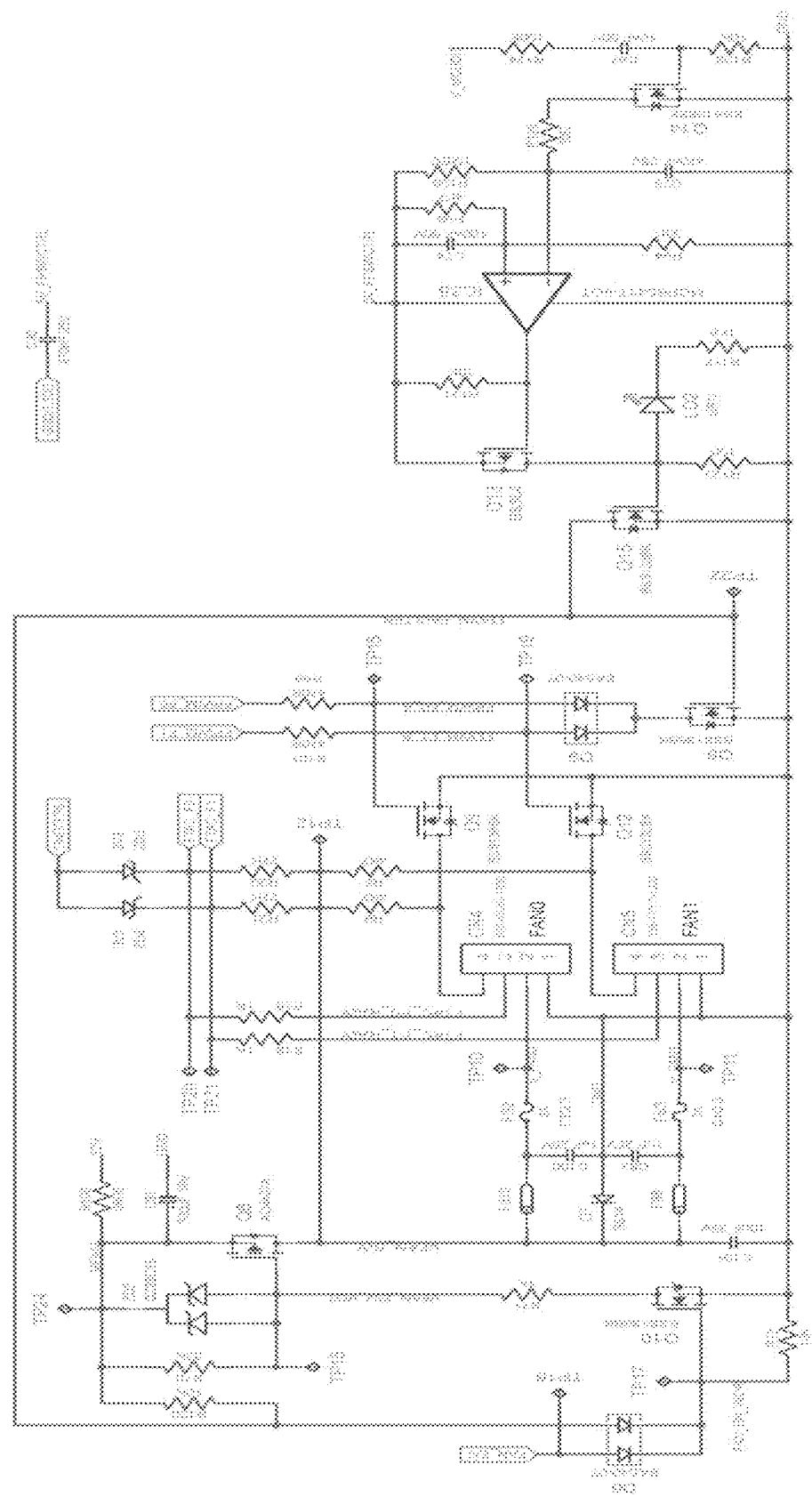
FIG. 14 shows one embodiment of fan circuitry wherein 12V is also fed to two cooling fans within the server.
Figure 15:
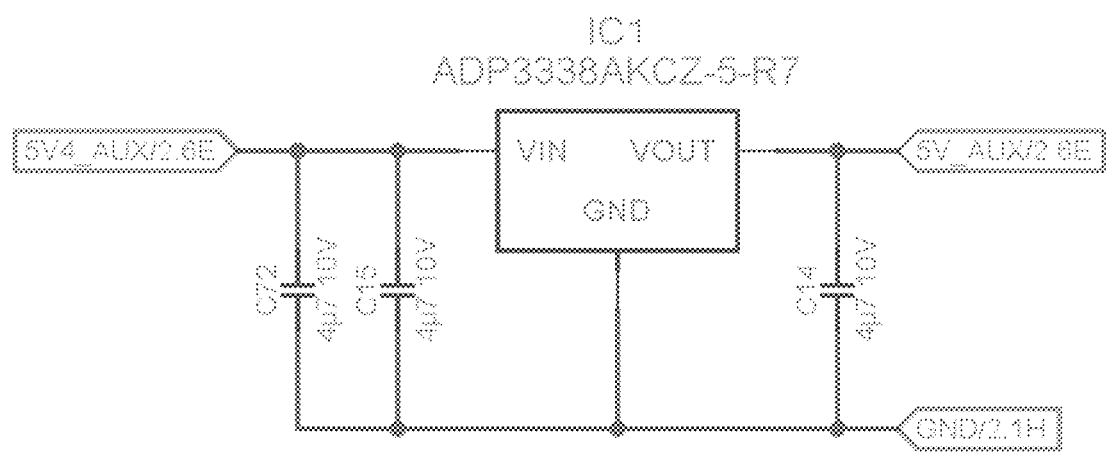
FIG. 15 shows one embodiment of 5V secondary supply.
Figure 16:
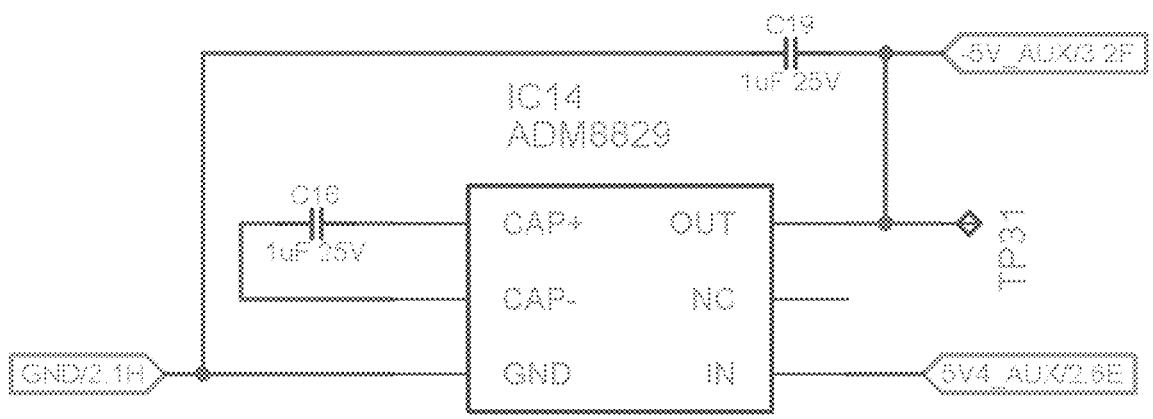
FIG. 16 shows one embodiment of 5V output converter.
Figure 17:
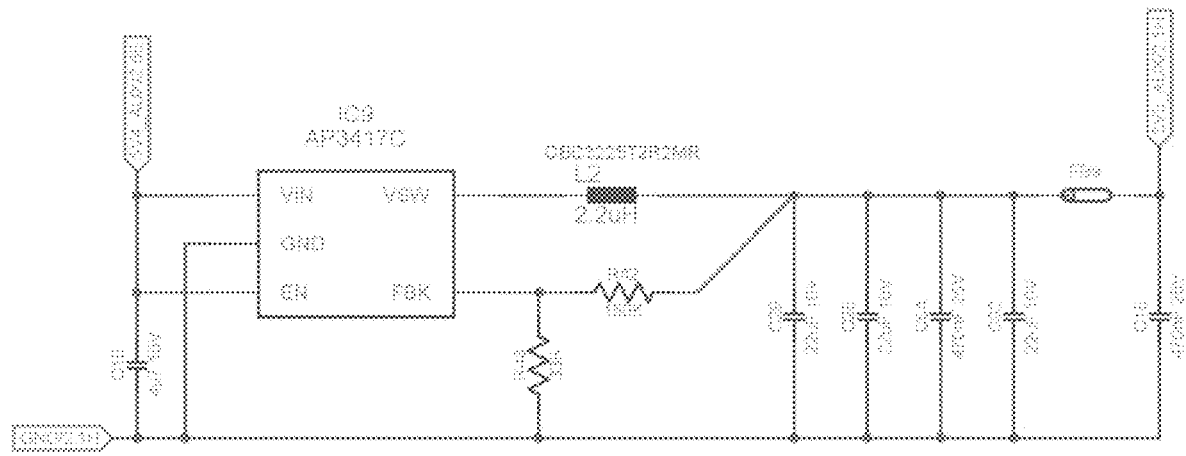
FIG. 17 shows one embodiment of 3.3V secondary supply.
Figure 18:
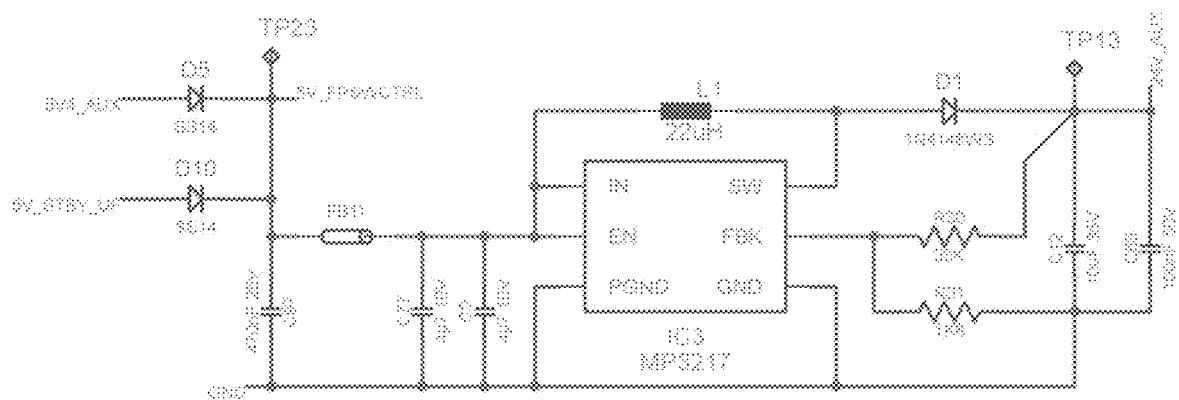
FIG. 18 shows one embodiment of 24V secondary supply.
Figure 19:
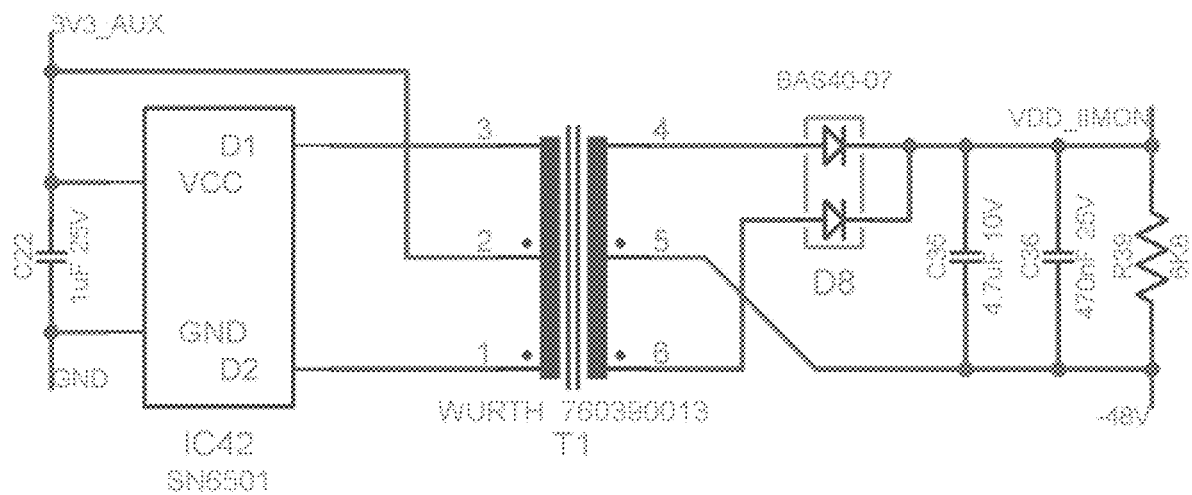
FIG. 19 shows one embodiment of isolated 5V supply circuit.
Figure 20:
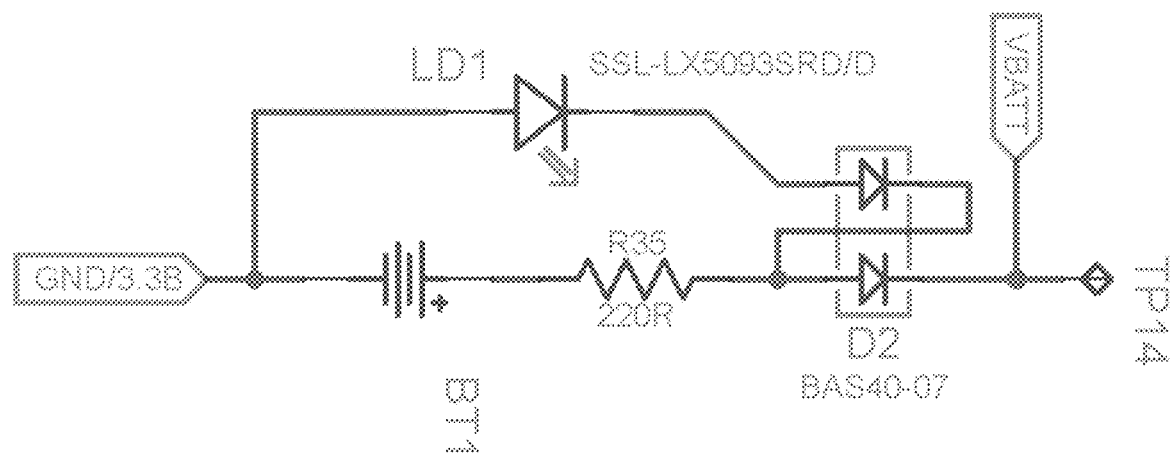
FIG. 20 shows one embodiment of RTC battery circuit.

In addition to the 12V supply being fed to the 12V switch and 5V_STBY regulator, 12V is also fed to the fan circuitry which provides power to the two cooling fans within the server. This circuitry can be seen in FIG. 14.

In the ideal design, the fan control circuitry has multiple functions, including fail-safes. The main fail-safe is made of comparator IC 35, which turns the fans ON at full speed in case the P&CB microcontroller stops giving a periodic "heartbeat" pulse, which would happen when the microcontroller has a software hang. The fans will also be turned on at full speed when the auxiliary supply fails.

In addition, the microcontroller itself can turn ON and OFF the 12V supply going to the fans, in order to save power, and it also is in charge of managing the PWM (Pulse Width Modulation) speed control of the fans, along with monitoring the fan speed via the tachometer within each of the fans. An individual fuse for each fan reduces possible fire hazards, since the 12V DC-DC converter can provide enough current to cause significant heating within the fan wires and the fan itself, shall either one of the fans have an electrical or mechanical failure.

Another important part of the Power Train is the auxiliary 5.4V supply (FIG. 10), as provided by the AUX DC-DC converter. This power source feeds power to the monitoring and control circuitry within the server, most of which is located on the P&CB. There are multiple voltages required, which the following voltage regulator and supply circuits (FIGS. 15, 16, 17, 18, 19, and 20.) provide.

Control Circuitry

The Control Circuitry makes up the heart of the preferred embodiment of the computer server detailed in this patent. Its purpose is to create the interface between the server itself and the human world, wherein data center operators and IT (Information Technology) professionals can monitor server status and various other functionalities.

Figure 21:
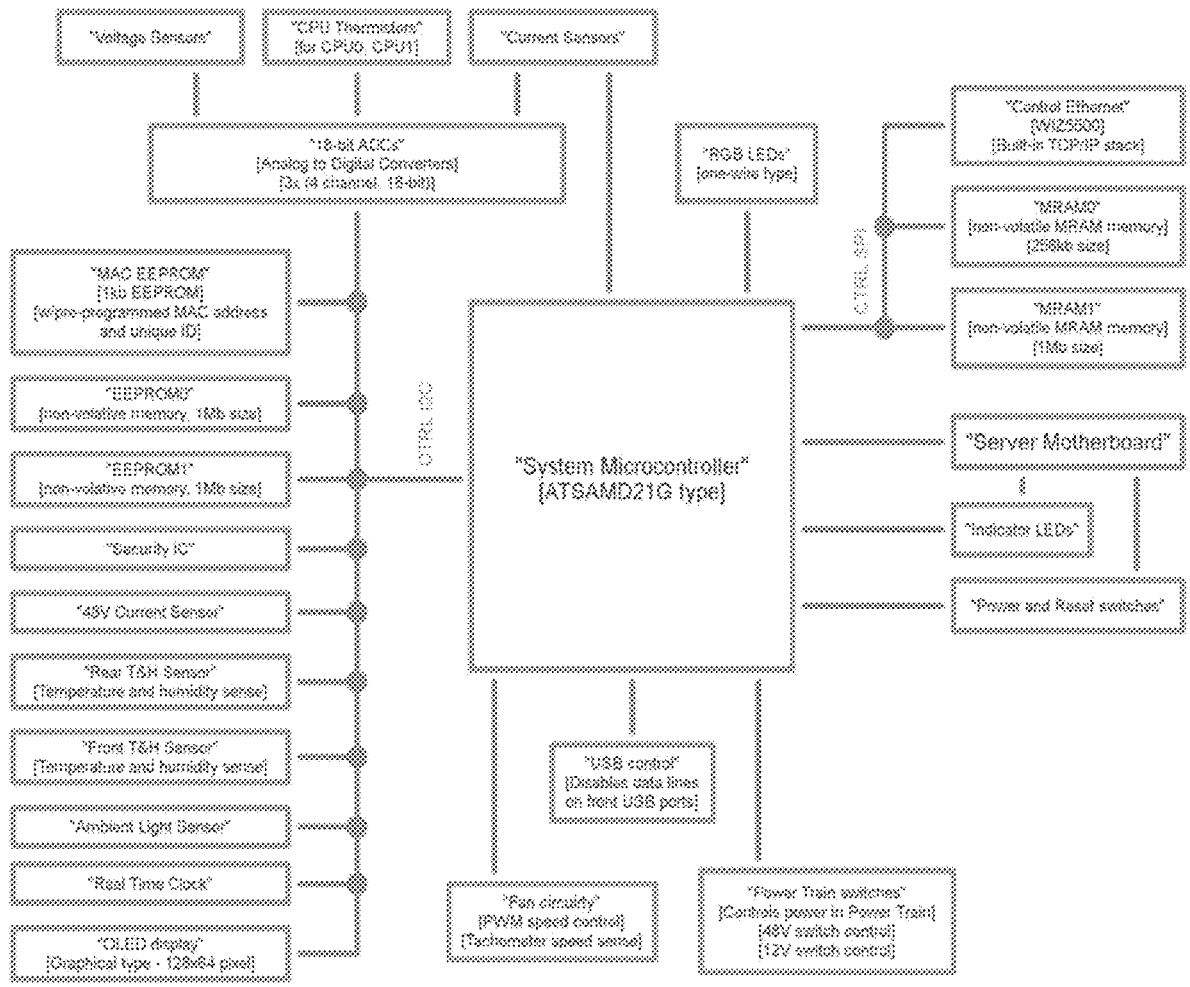
FIG. 21 shows one embodiment of a simplified overview of the Control Circuitry structure

FIG. 21 shows a simplified overview of the Control Circuitry structure.

As can be seen, there are a number of sensors and human interface devices (HID) connected to the System Microcontroller. The following paragraphs detail the exact circuitry involved in this moderately complex system, starting with the components located on the Power and Control Board, then the rest of the Control Circuitry components, which are all located within the server housing.

Figure 22:
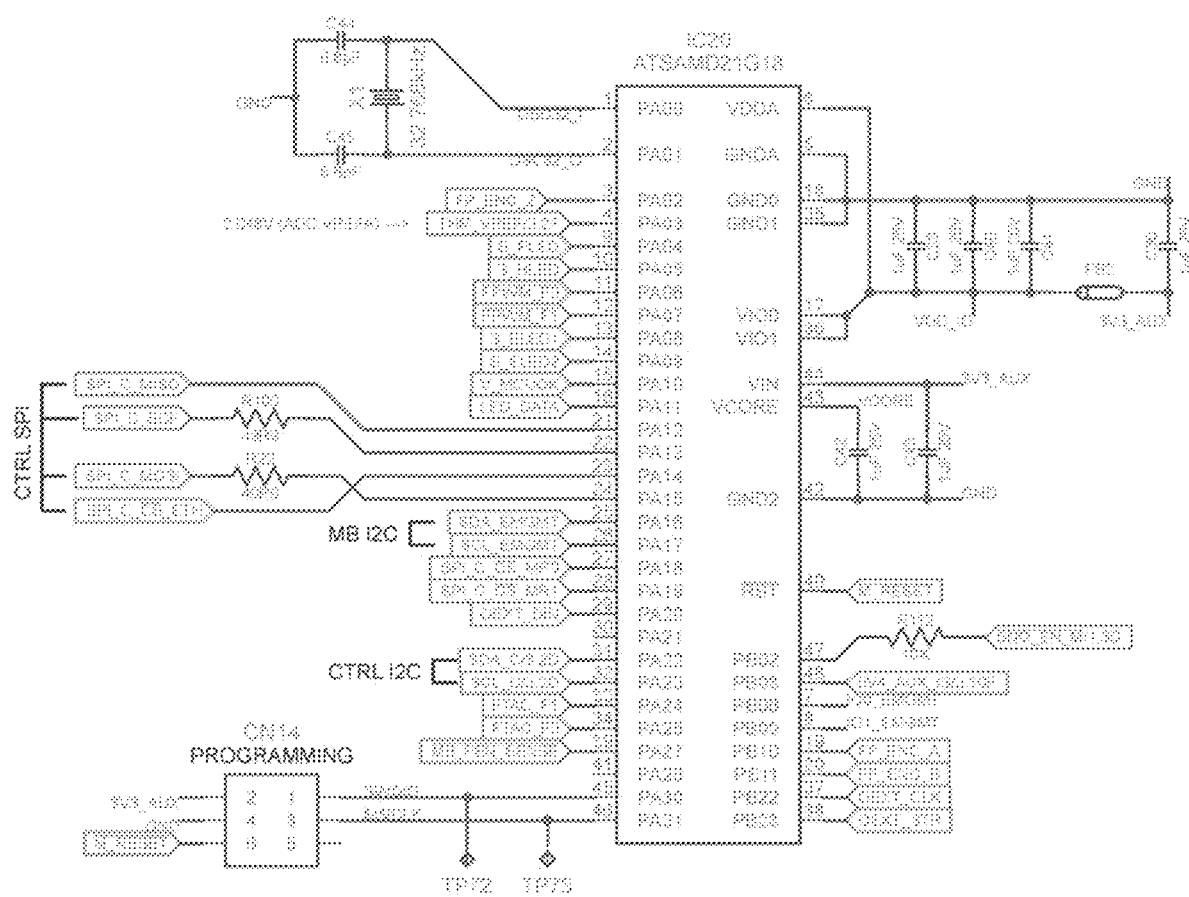
FIG. 22 shows one embodiment of a System Microcontroller.
Figure 23:
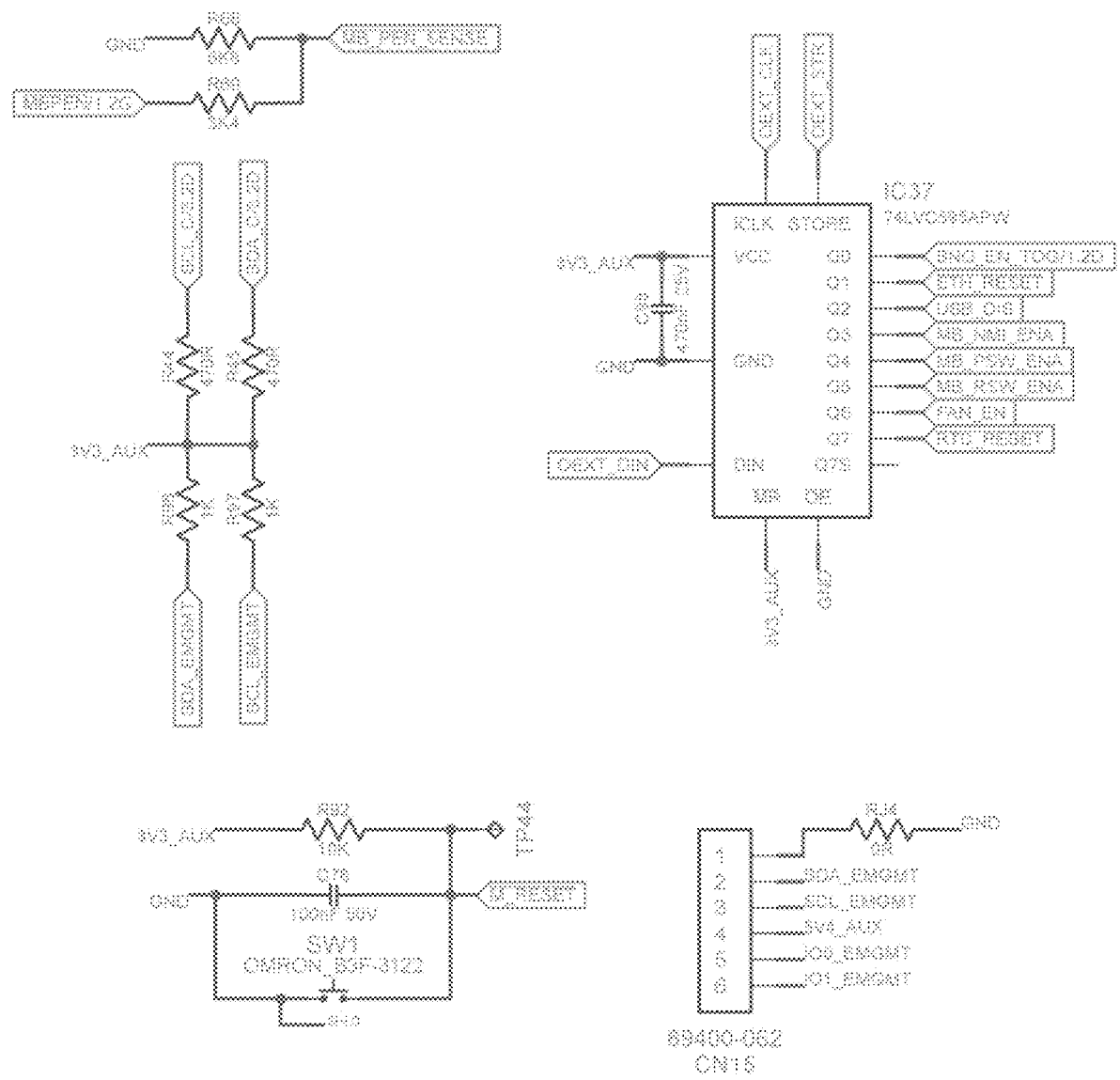
FIG. 23 shows additional supporting circuitry for the System Microcontroller, including the Output Extender, reset button and pull-up resistors

First off, and most notably, is the System Microcontroller, at the heart of the Control Circuitry. The System Microcontroller is a miniature computer on a chip, which can input and output signals and information through its I/O (Input/Output) pins, process data, and store data within its internal memory and data storage structures. In the preferred embodiment, this microcontroller is the ATSAMD21G18, made by the integrated circuit manufacturer Microchip/Atmel. It operates at a clock frequency of 48 MHz, and has a multitude of I/O pins (almost 36, most of which are put to use in the preferred embodiment of this invention). The System Microcontroller is depicted as IC 20 in the schematic FIG. 22. There is additional supporting circuitry for the System Microcontroller, including the Output Extender, reset button and pull-up resistors, all shown in FIG. 23.

CN15 is for adding support to control the computer server RAM and/or access for debugging purposes or other features. SW1 is the reset button for the System Microcontroller. IC 37 forms the Output Extender. The Output Extender has the advantage of providing more outputs for the System Microcontroller, and in addition, those outputs are independent of the System Microcontroller. This means that, if the System Microcontroller needs to reset, the output states of the Output Extender won't change, thus preventing further upsets within the computer server and Control Circuitry structure.

Control of the fans in the server is performed by the fan control circuitry. See FIG. 14 and related paragraphs from the Power Train section for more details.

Figure 24:
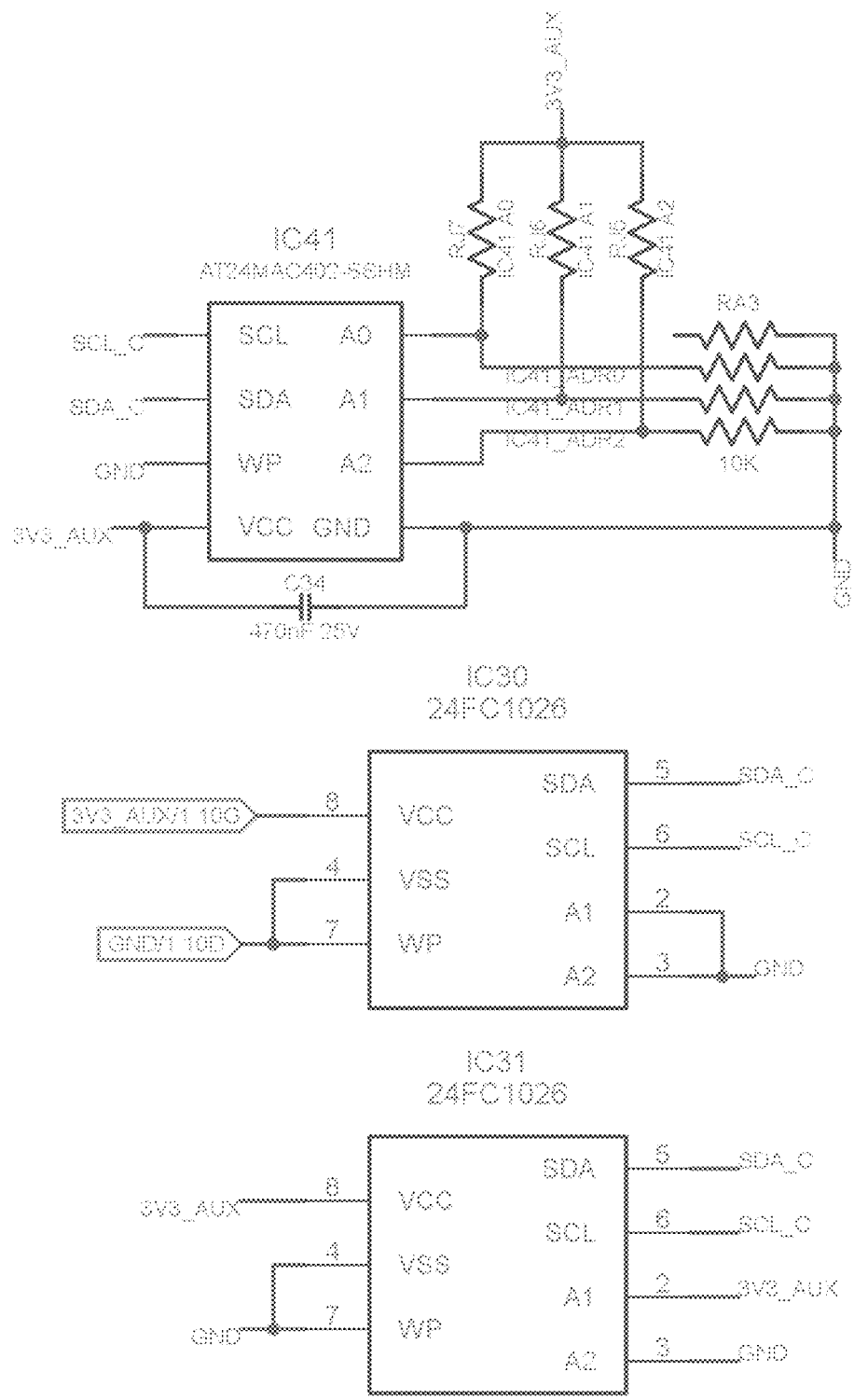
FIG. 24 shows one embodiment of EEPROM memory connections.
Figure 25:
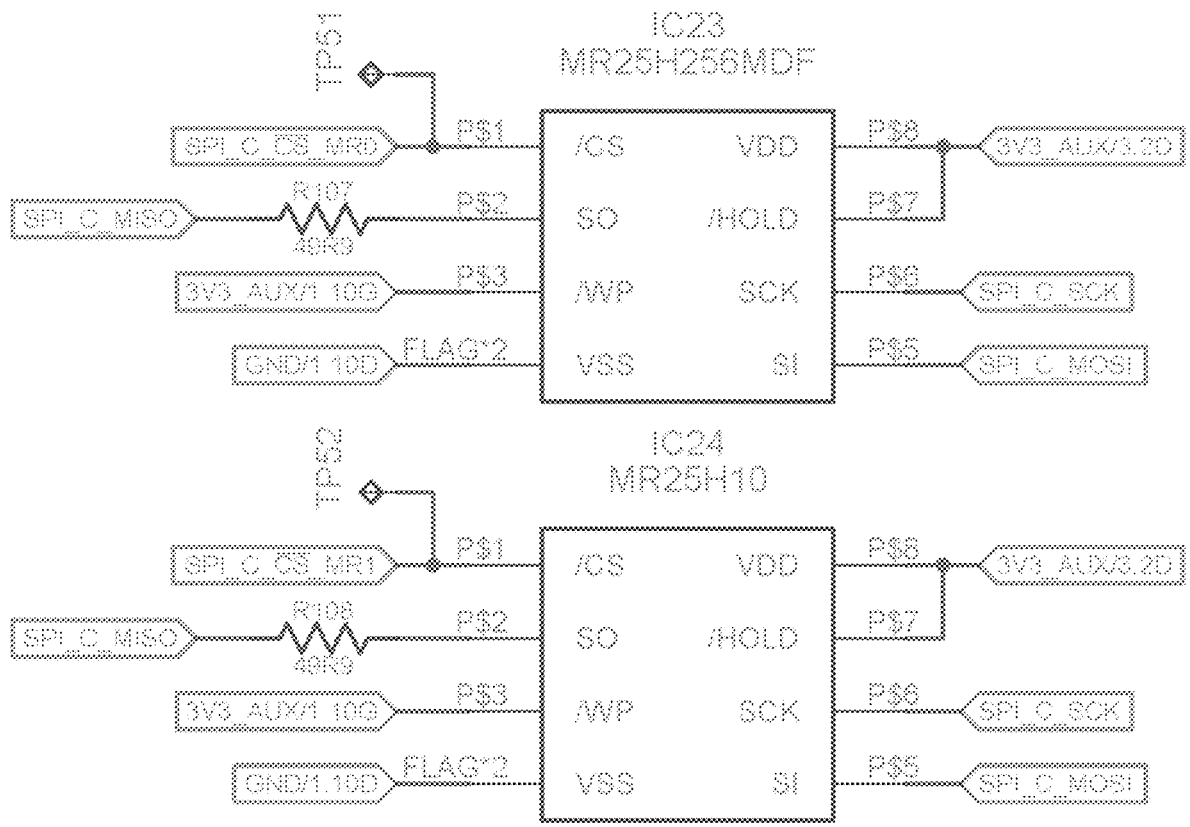
FIG. 25 shows one embodiment of embodiment of MRAM memory connections.

FIGS. 24 and 25 detail the EEPROMs (Electrically Erasable Programmable Read-Only Memory) and MRAMs (Magnetoresistive Random-Access Memory) which are used for data logging. Multiple units are included on the Power and Control Board.

One is for customer logging and the other (with separate security) is for the manufacturer's logs.

Figure 26:
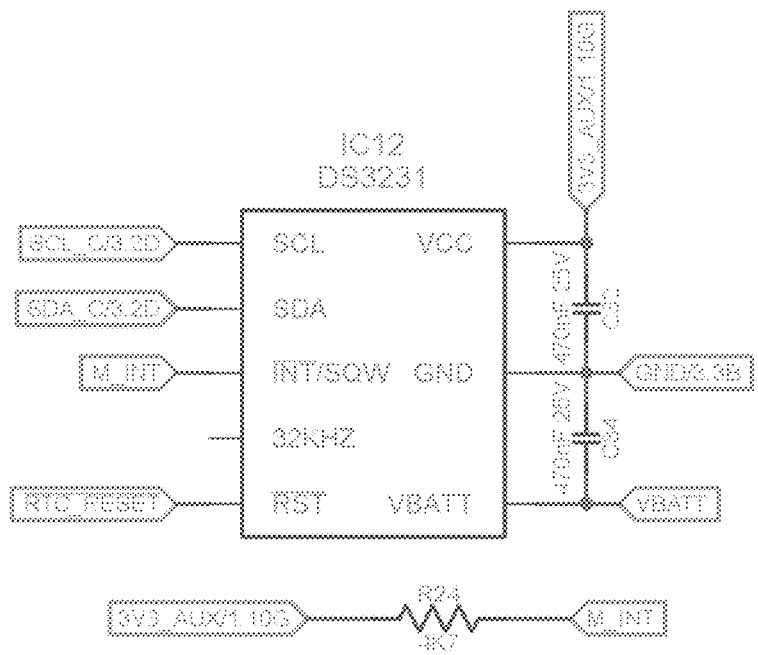
FIG. 26 shows one embodiment of a Real Time Clock ("RTC") chip.

FIG. 26 depicts the Real Time Clock ("RTC") chip, IC 12. This particular RTC—the DS3231 made by Maxim Integrated—has a built-in TCXO (Temperature compensated crystal Oscillator). The RTC provides a precise, stable time for data logging and other purposes.

Figure 27:
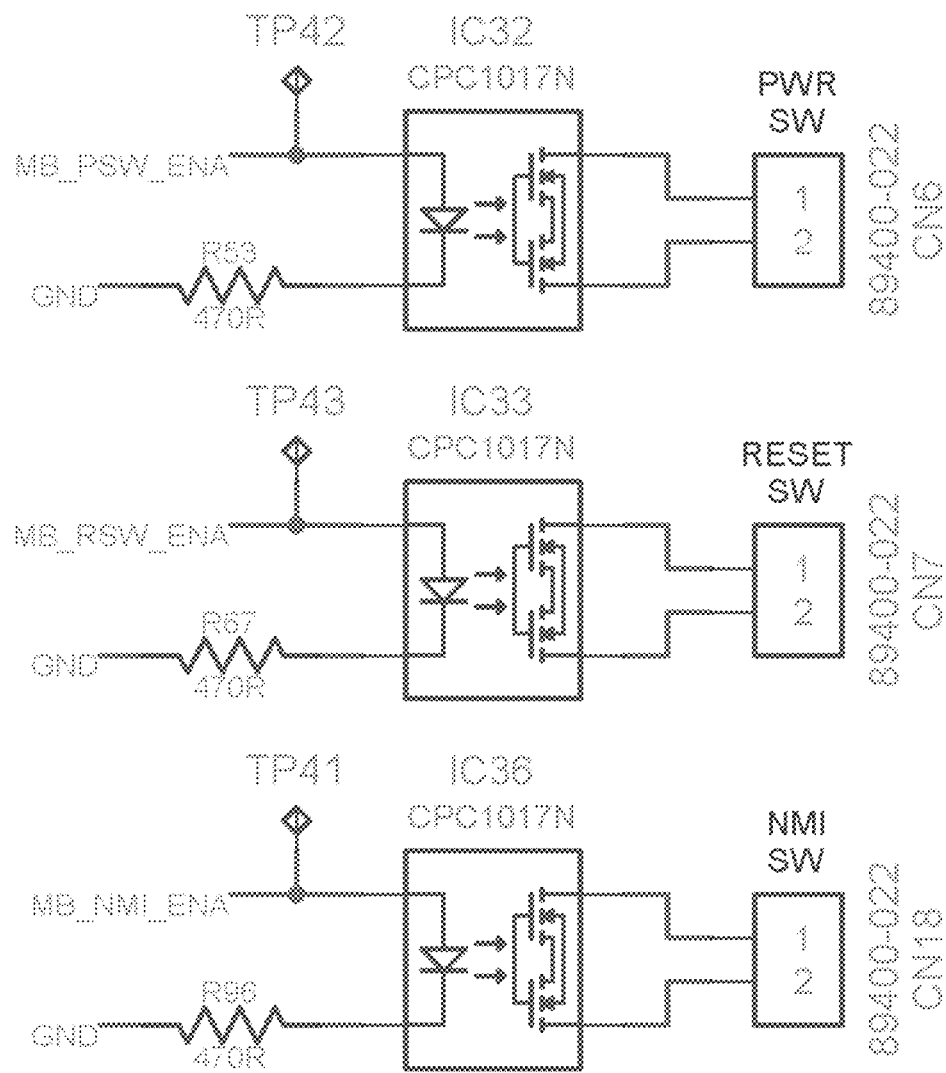
FIG. 27 shows three solid-state switches included on the Power and Control Board.

In order for the Control Circuitry to better control the Server Motherboard power state, three solid-state switches have been included on the Power and Control Board. Isolation is required since the motherboard's internal circuitry is unknown. The purpose of using solid-state relays is to prevent electrical ground loops and improve the reliability compared to using the classical electro-mechanical type relay. These three relays are shown in FIG. 27.

Figure 28:
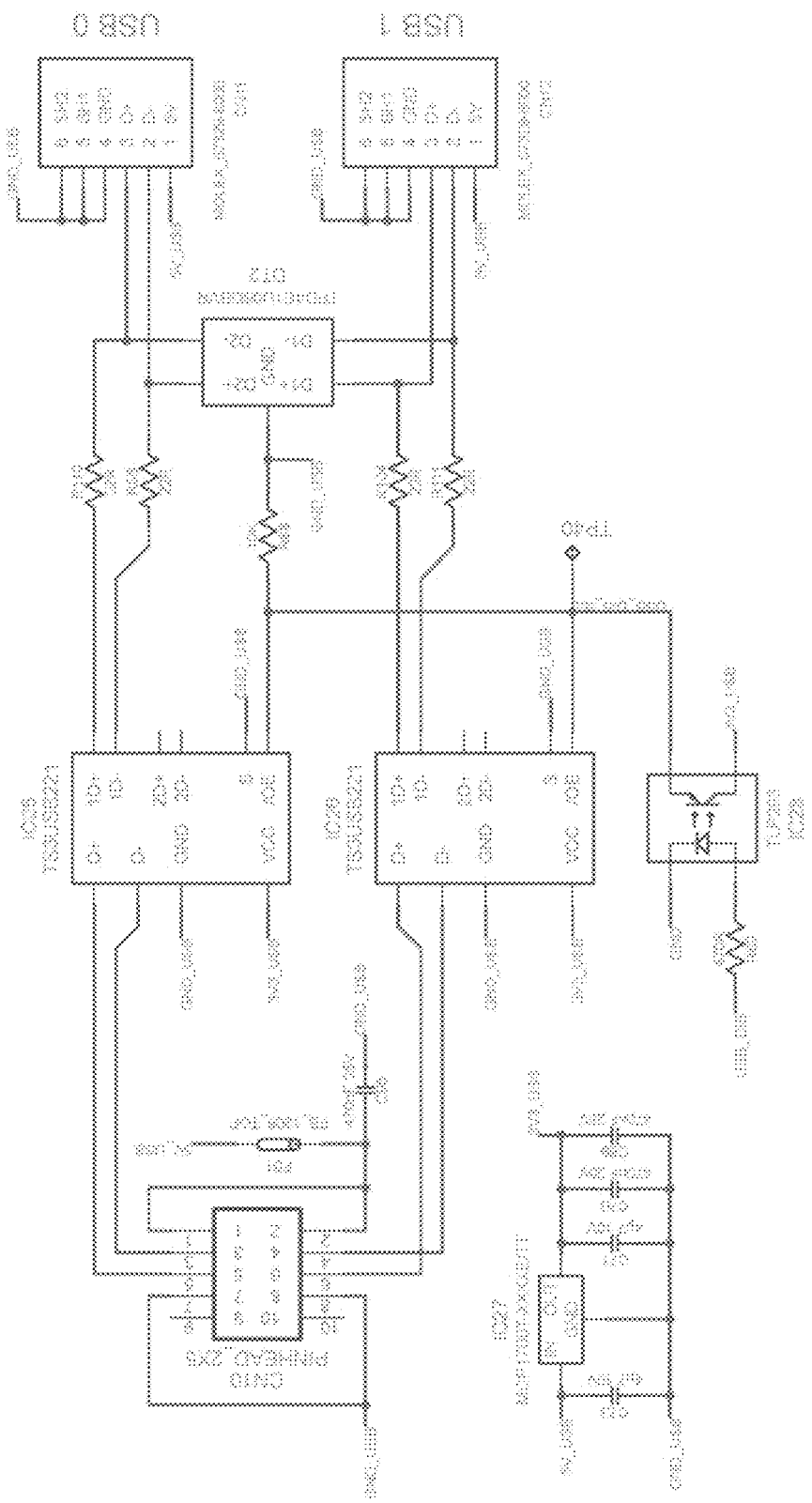
FIG. 28 shows one embodiment of USB Control circuitry, which is used to disable the data transfer through the two USB ports at the front of the server.

FIG. 28 depicts the USB Control circuitry, which is used to disable the data transfer through the two USB ports at the front of the server. Similar to the above circuit, the USB Control circuitry is electrically isolated from the Control Circuitry in order to prevent ground loop hazards, which can cause problems with electrical interference current flowing through wires that are not supposed to carry significant current.

Figure 29:
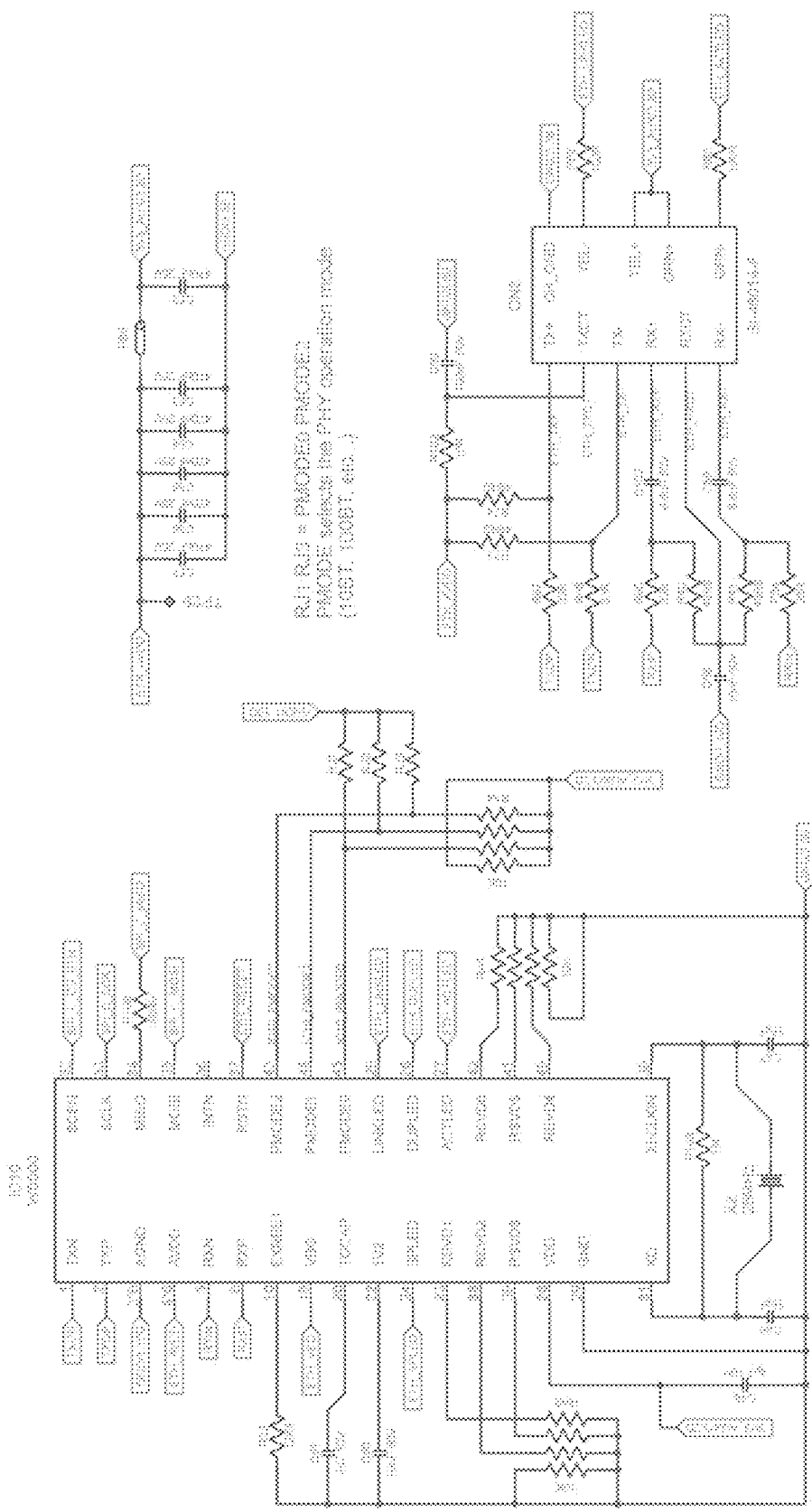
FIG. 29 shows one embodiment of an Ethernet control chip.
Figure 30:
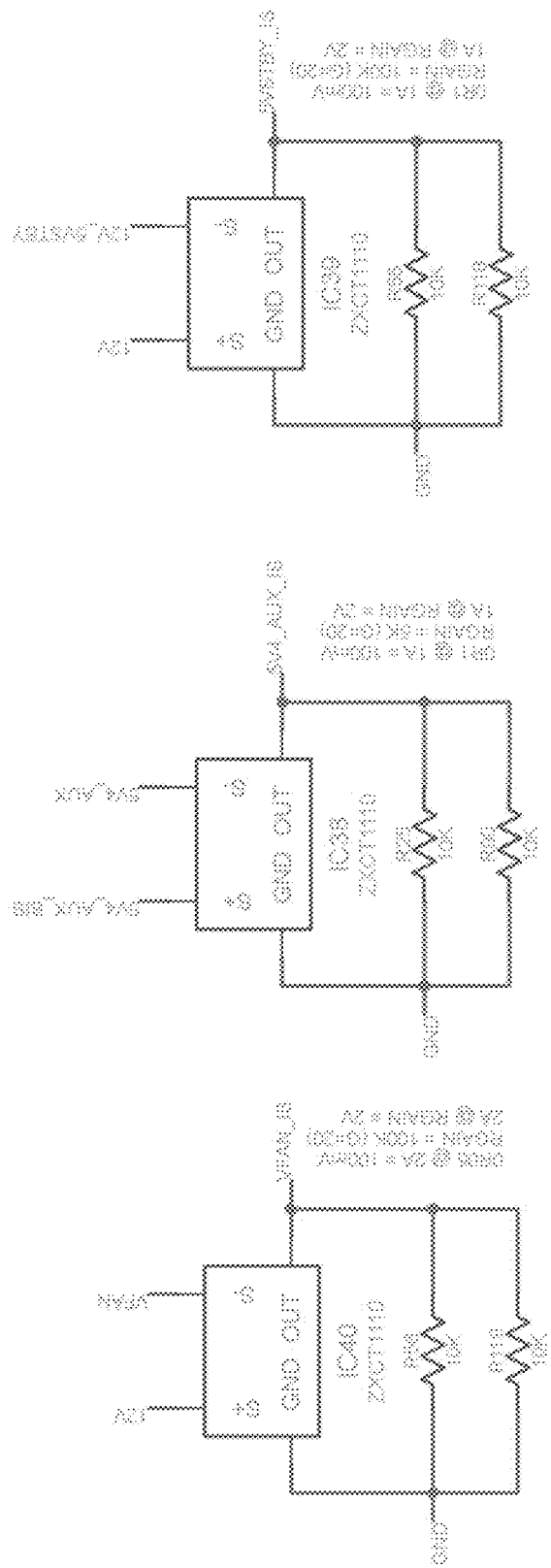
FIG. 30 shows one embodiment of shunt-type current sensors.
Figure 31:
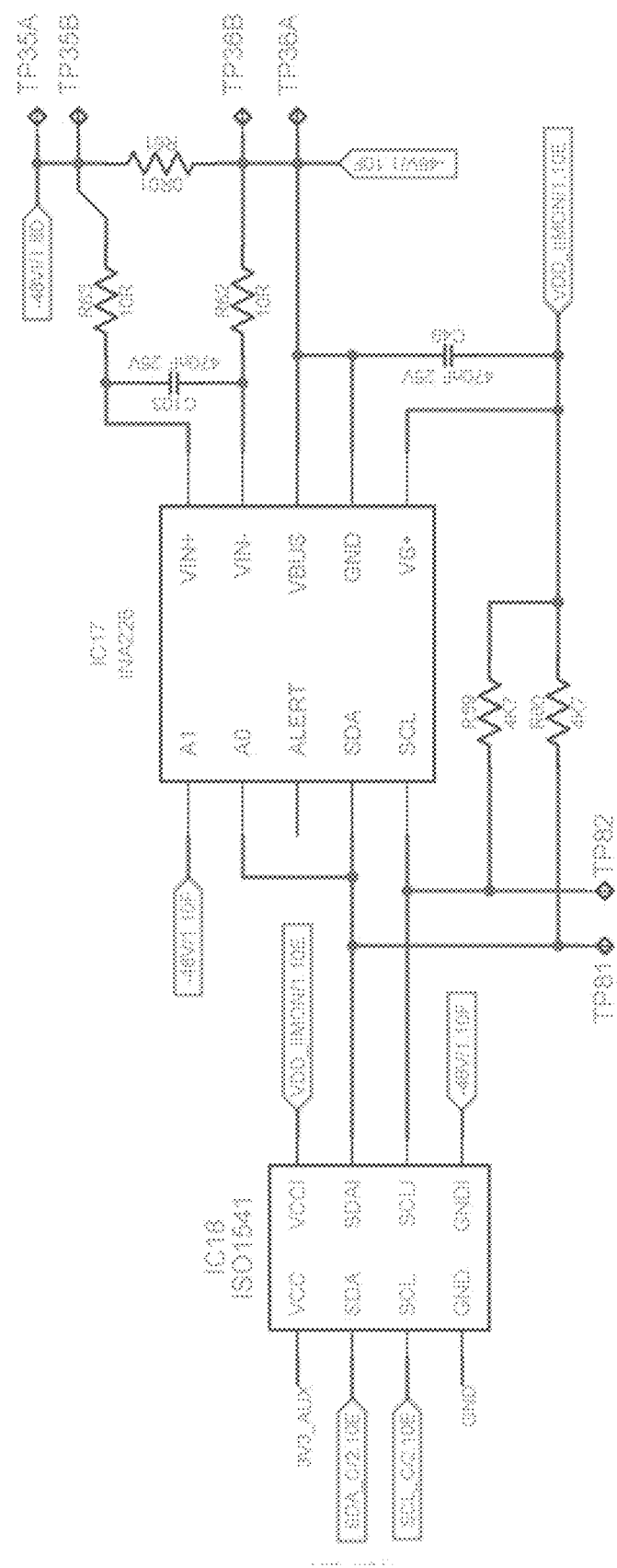
FIG. 31 shows one embodiment of isolated shunt-type current sensor.
Figure 32:
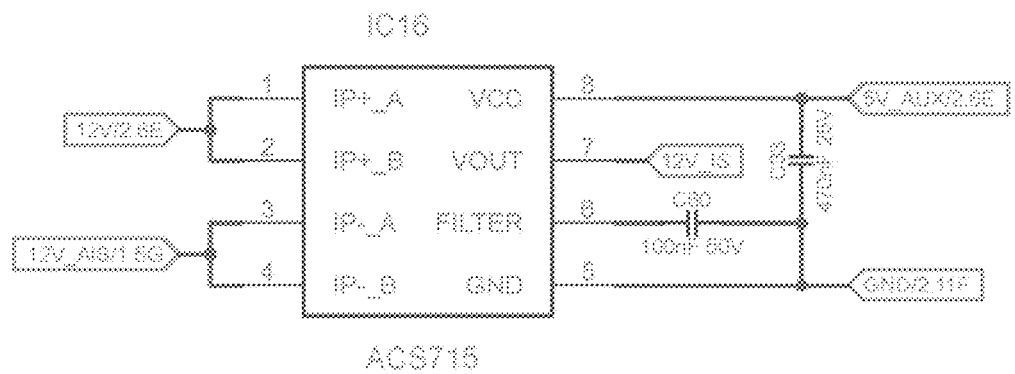
FIG. 32 shows one embodiment of Hall-effect current sensor.
Figure 33:
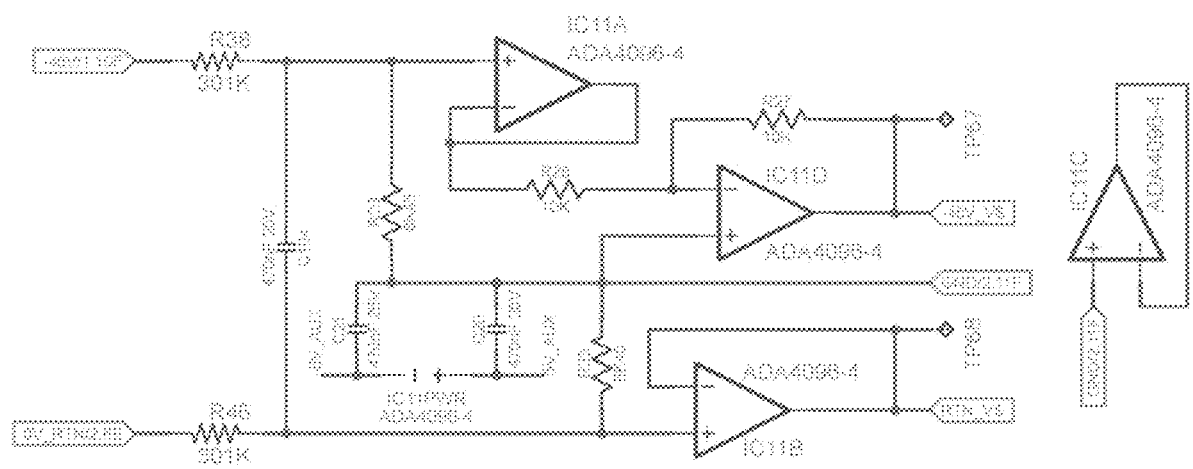
FIG. 33 shows one embodiment of −48V voltage sensor circuitry.
Figure 34:
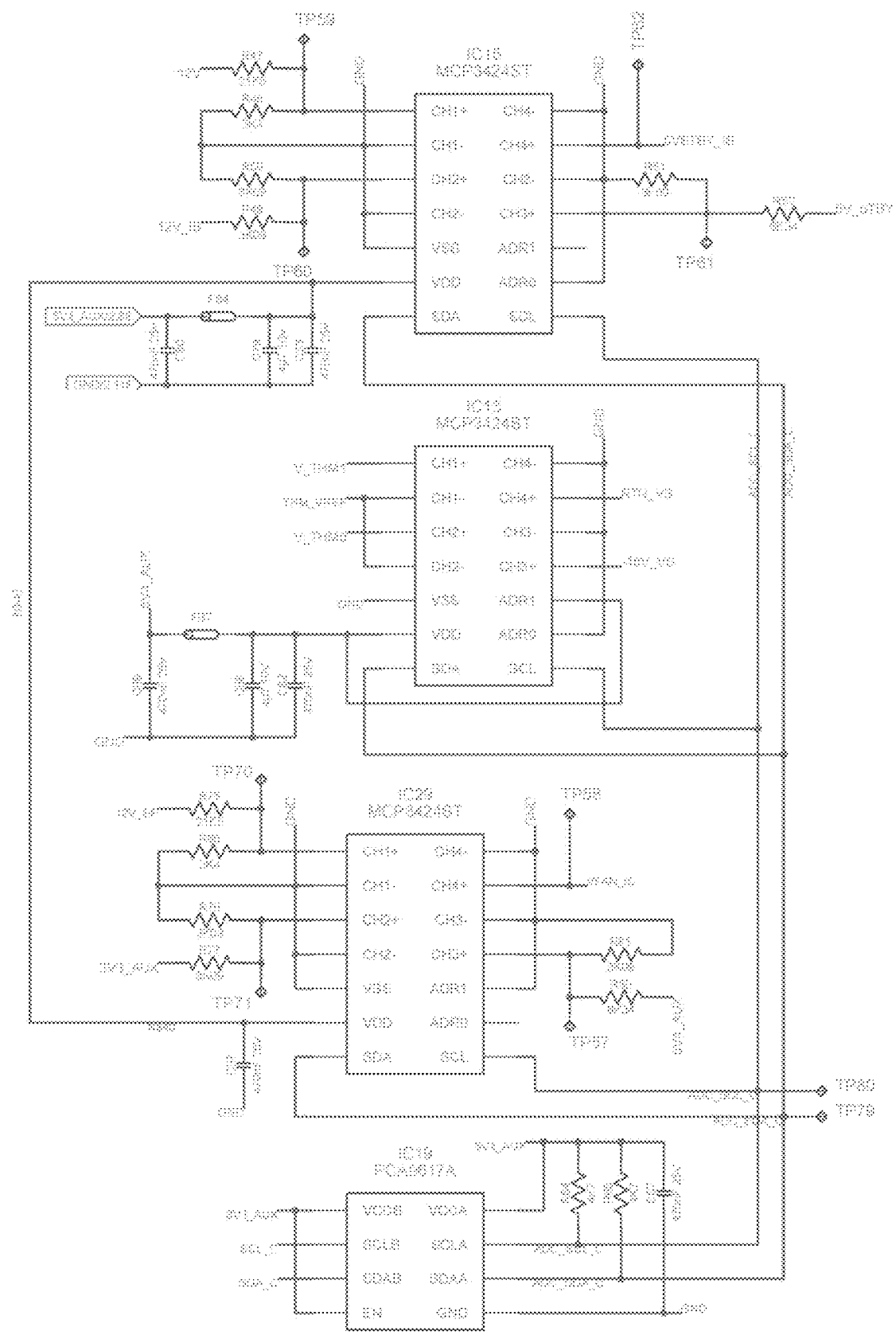
FIG. 34 shows one embodiment of ADCs to digitize various sensor voltages.
Figure 35:
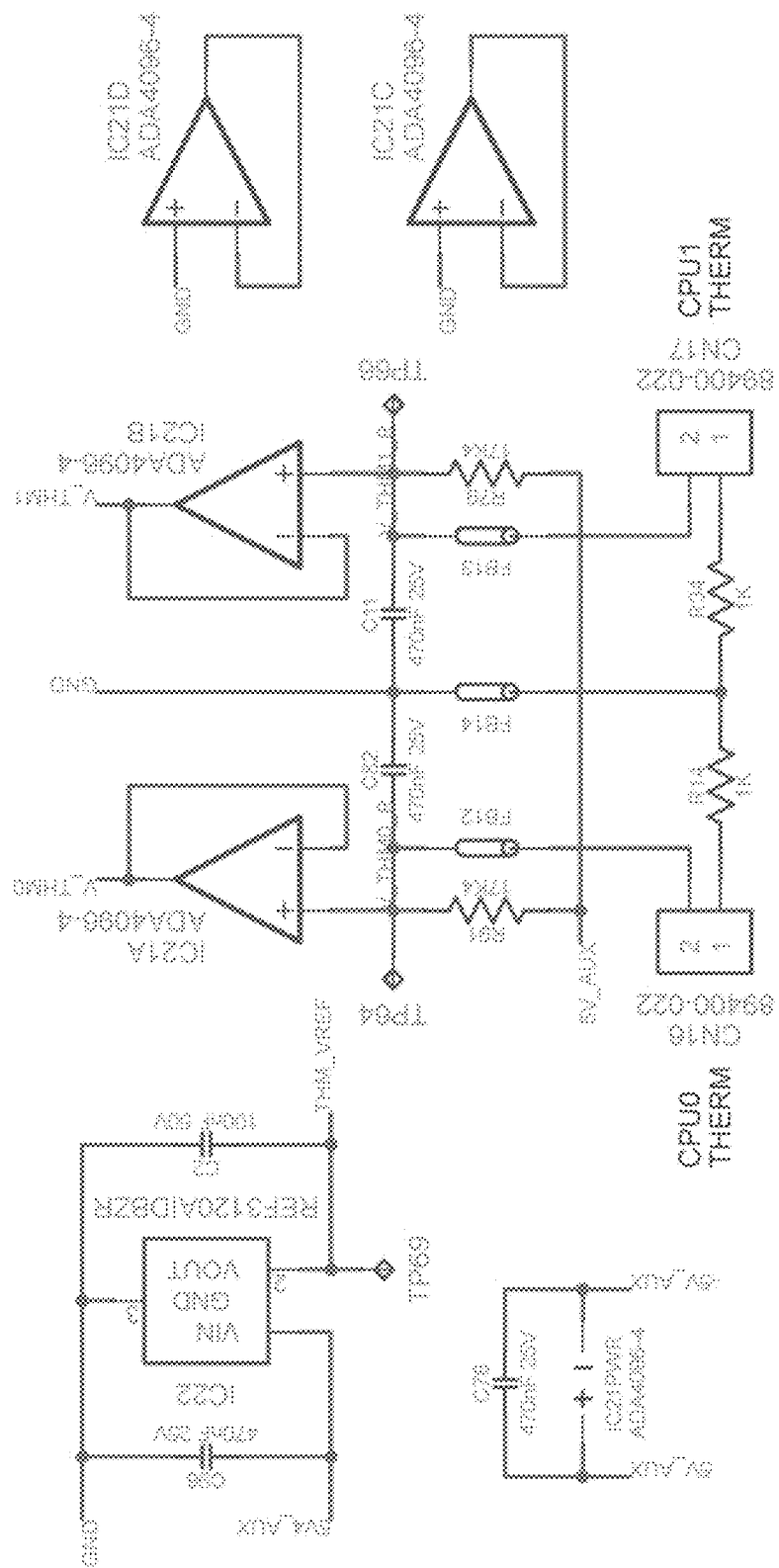
FIG. 35 shows one embodiment of CPU temperature and humidity sensor connections.

An important part of this invention is the Ethernet connection to enable the end-user to remotely control and monitor server status. This is done through a standard Ethernet network connection, preferably one that is local to the building or environment of use, thus providing a layer of security against unwanted software-based intrusions (cyber attacks). The Ethernet control chip, IC 10, shown in FIG. 29, has a built-in TCP/IP stack, thus eliminating extra software and processing load requirements for the System Microcontroller.

Another major part of the functionality of this invention is the power monitoring, which requires the careful tracking of both voltage and current flowing into the server. Additional circuitry monitors the power losses in the power and control board, fans, and other control circuitry features. The following six figures depict the current, voltage, and server CPU temperature monitoring circuitry.

Additional circuitry buffers the voltage from the CPU temperature sensors, in order to reduce inaccuracy caused by the current going into the ADC inputs.

Figure 36:
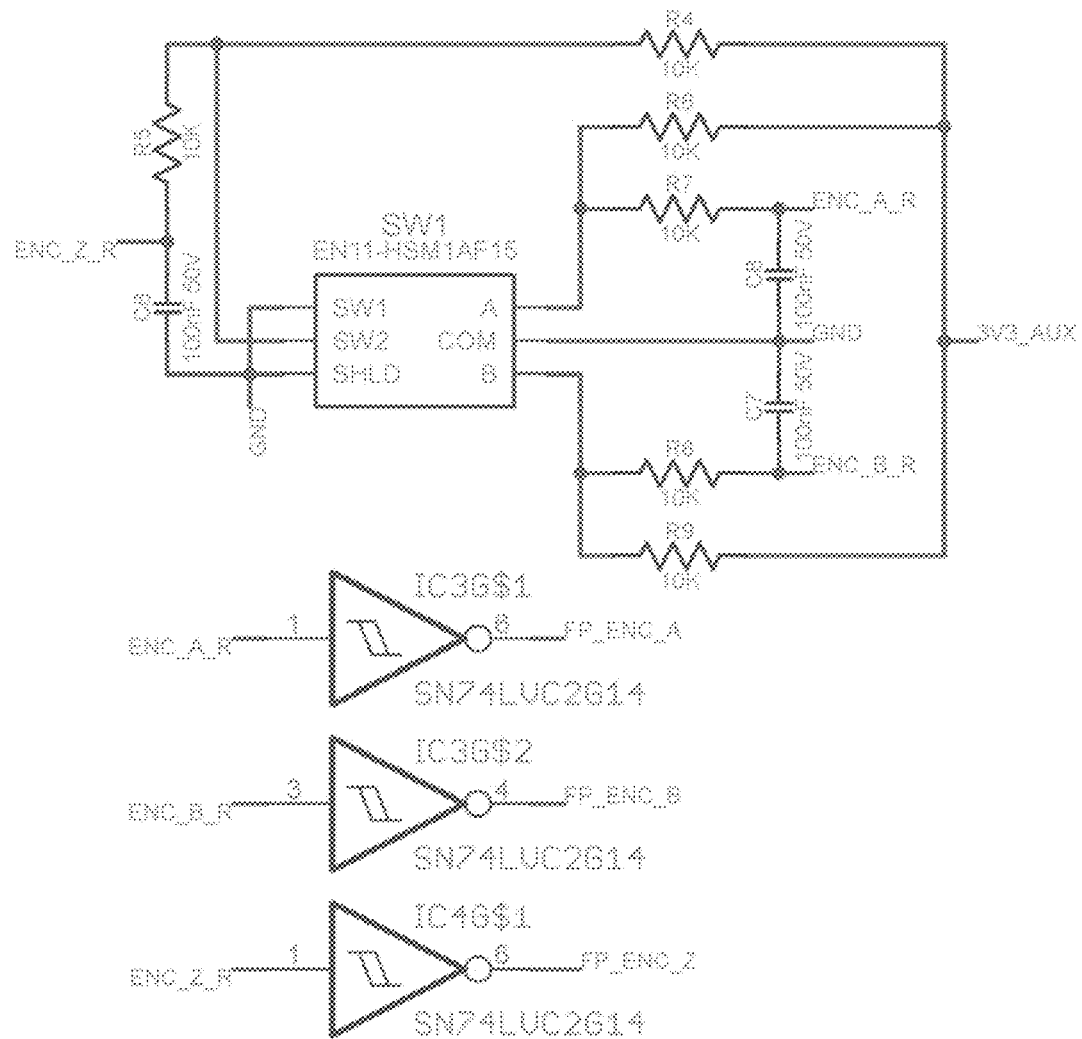
FIG. 36 shows one embodiment of a rotary encoder on the Front Panel, which allows the end-user to scroll through the menu on the OLED (Organic Light Emitting Diode display) also located on the Front Panel.
Figure 37:
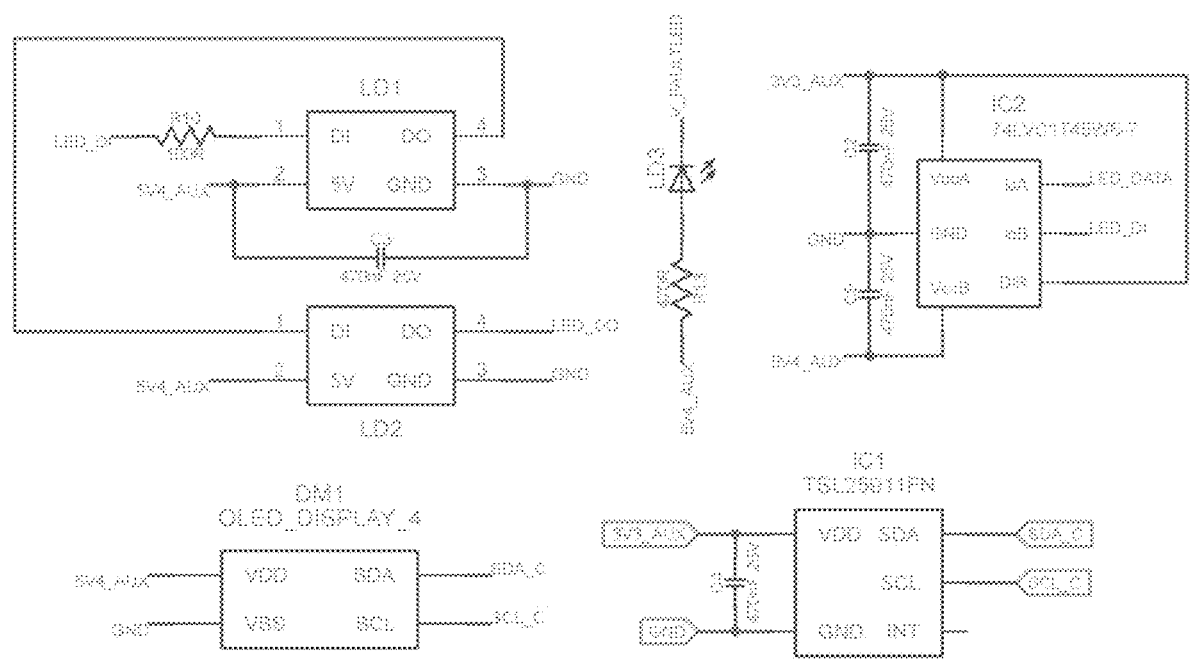
FIG. 37 shows one embodiment of an OLED (Organic Light Emitting Diode display.

Summing up the majority of the circuitry of the preferred embodiment of this invention, there are multiple indication and feedback components implemented in the computer server. A rotary encoder (FIG. 36) on the Front Panel allows the end-user to scroll through the menu on the OLED (Organic Light Emitting Diode display, FIG. 37) also located on the Front Panel. Also on the front panel is an ambient light sensor (IC 1, FIG. 37) to control the intensity of the displays.

Figure 38:
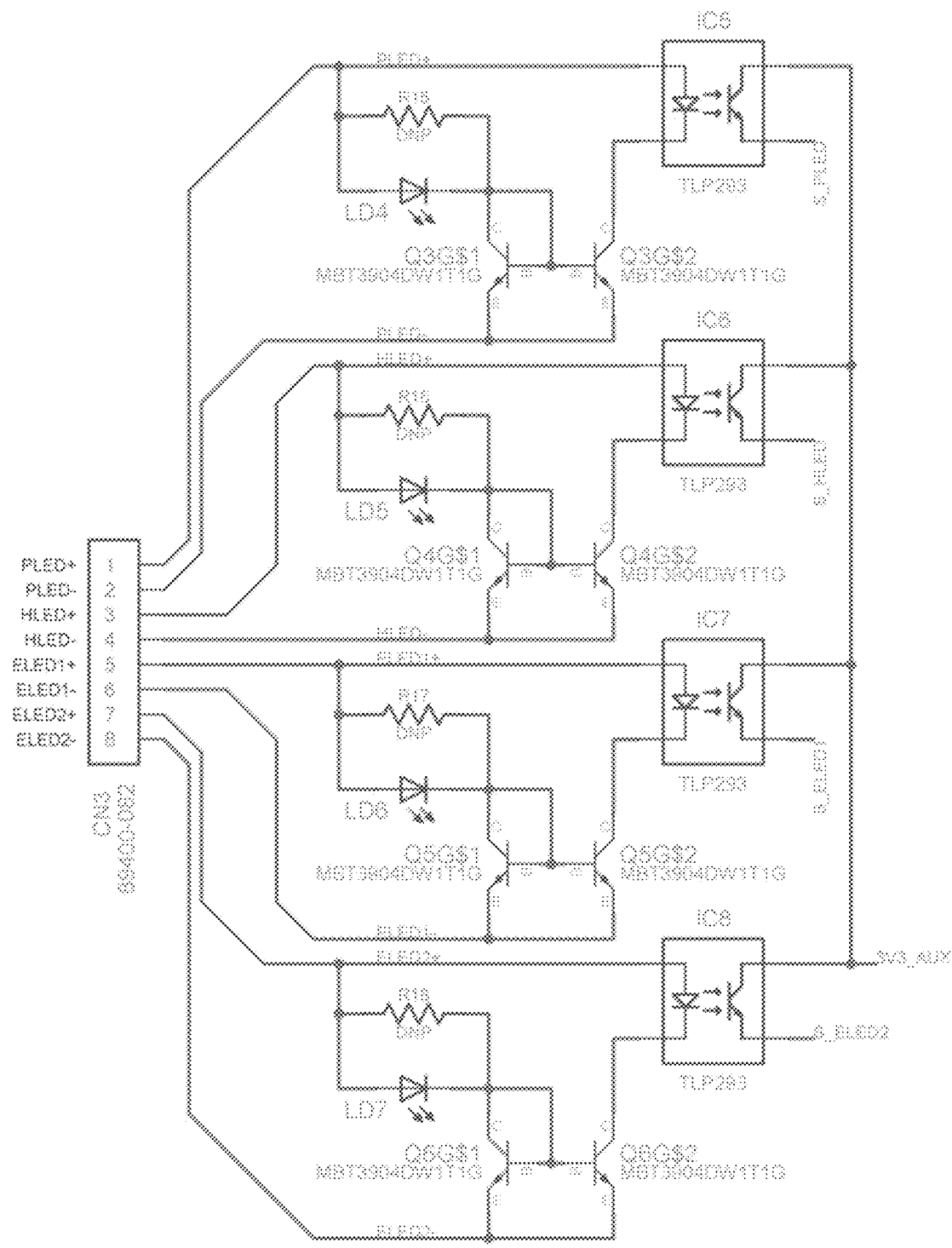
FIG. 38 shows one embodiment of a set of LEDs which are connected to the computer server motherboard, and sensed by the Power and Control circuitry.

Also on the front panel, are a set of LEDs that which are connected to the computer server motherboard, and sensed by the Power and Control circuitry. (FIG. 38)

Figure 39:
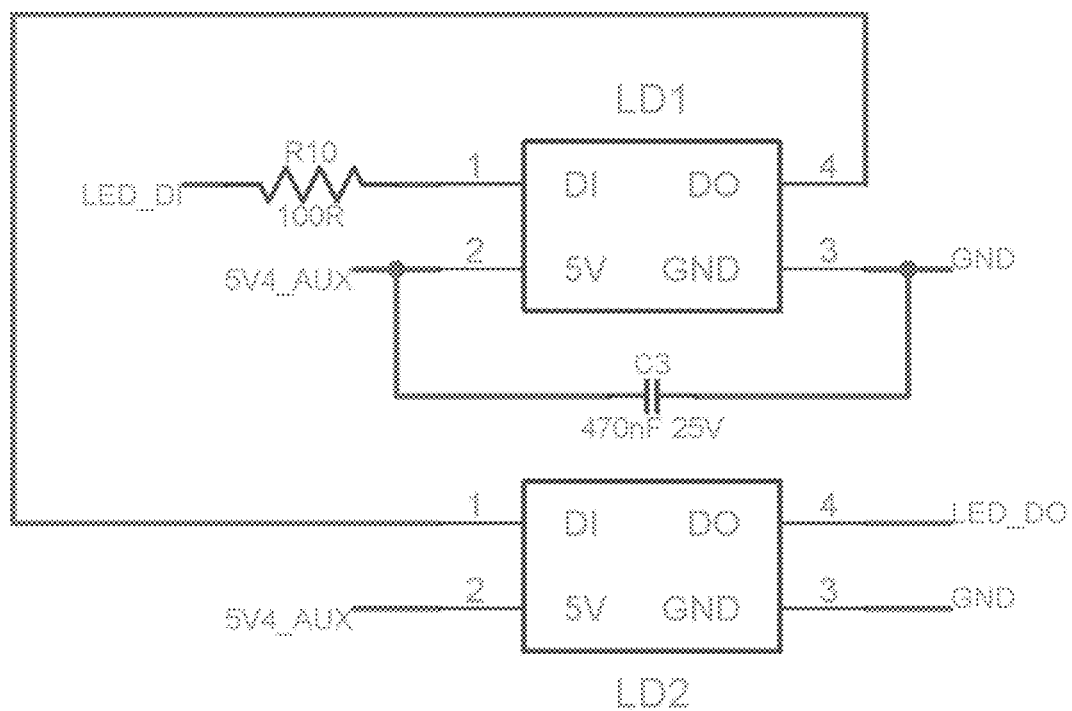
FIG. 39 shows one embodiment of front panel RGB LED connections.
Figure 40:
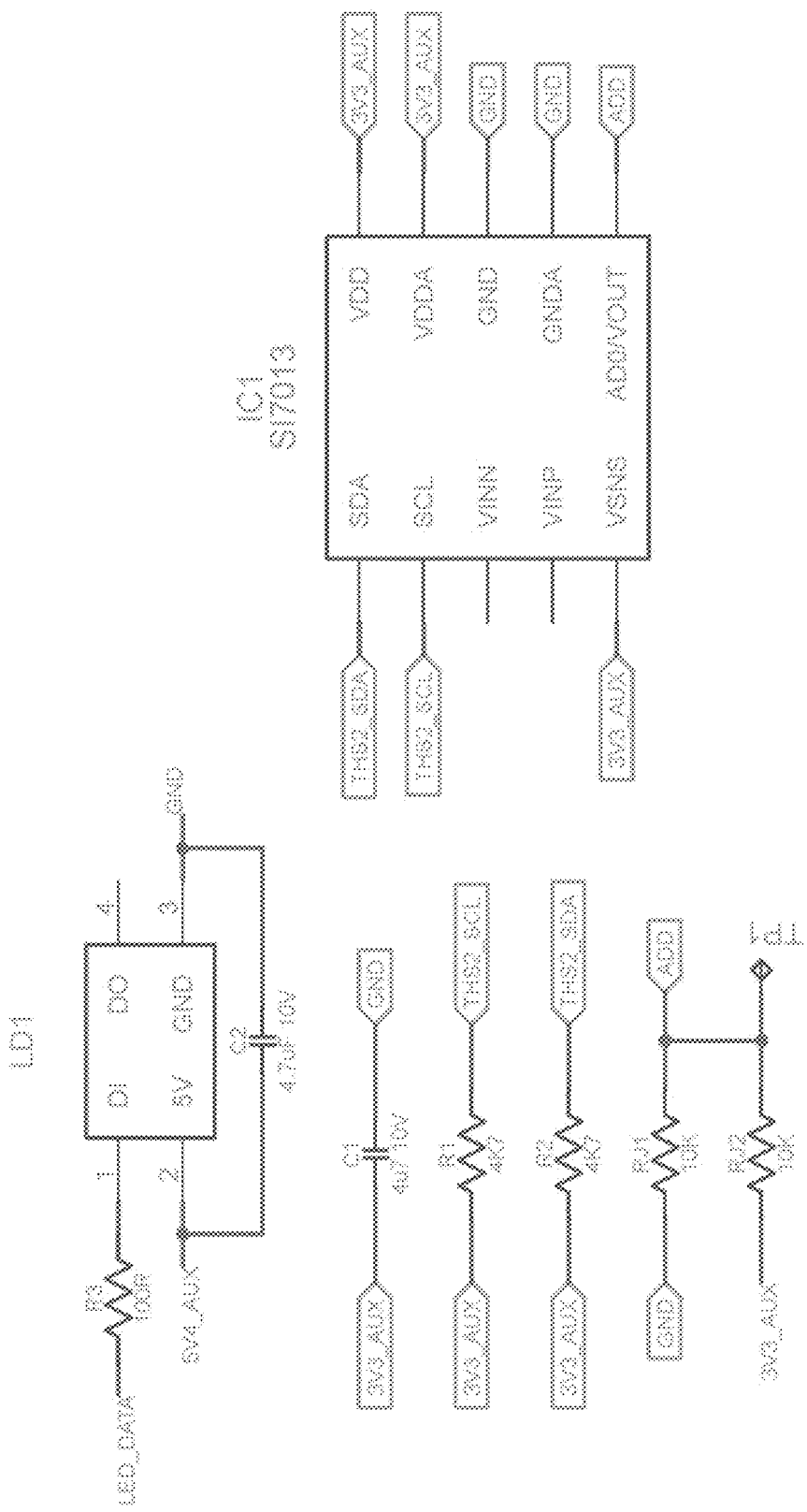
FIG. 40 shows one embodiment of rear panel temperature and humidity sensor connections.
Figure 41:
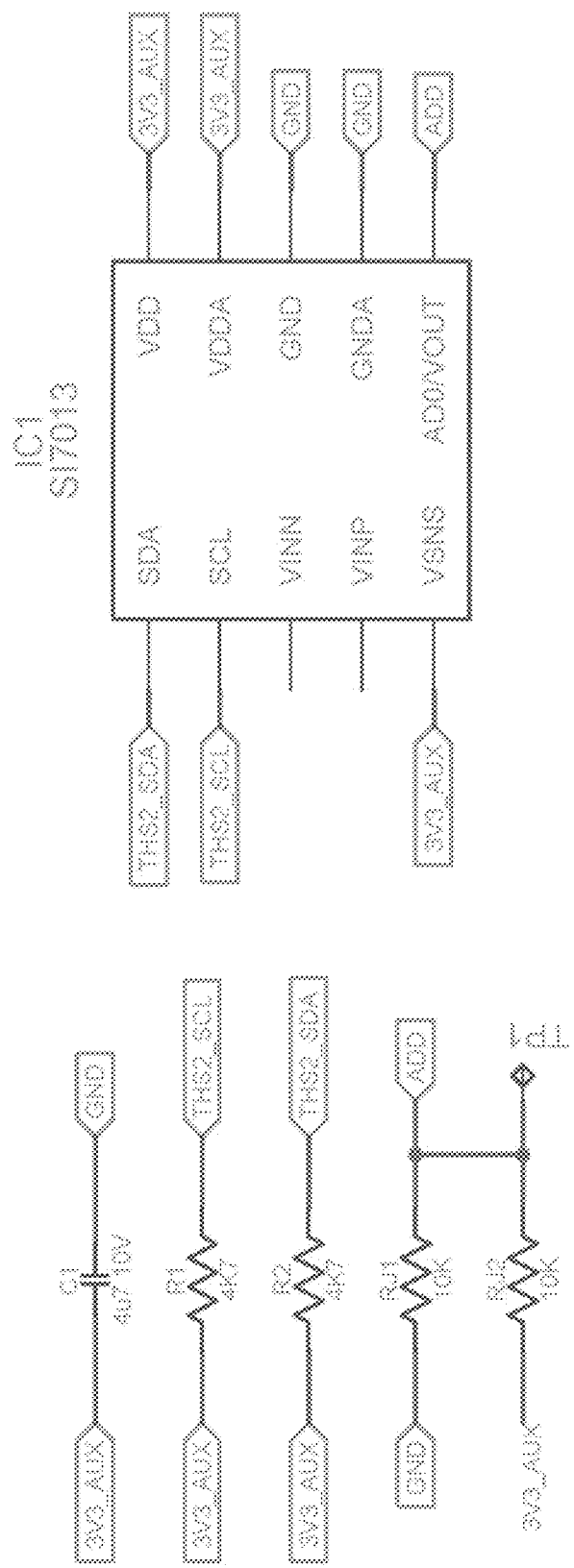
FIG. 41 shows one embodiment of front panel temperature and humidity sensor connections.

On both the front panel and rear panel of the server enclosure are RGB indicator LEDs. The RGB LEDs allow a variety of information to be displayed, and be visible from a fair distance away, such as down a short hall way or corridor, or across a room. The electrical hookup of these LEDs is shown in FIGS. 39 and 40.

In addition to the LEDs, there are temperature and humidity sensors 100 on both the front and rear panels, which are used to measure the intake/outtake air temperature and humidity, in order to control the cooling fan speeds and monitor environmental conditions.

Geometry

Figure 5:
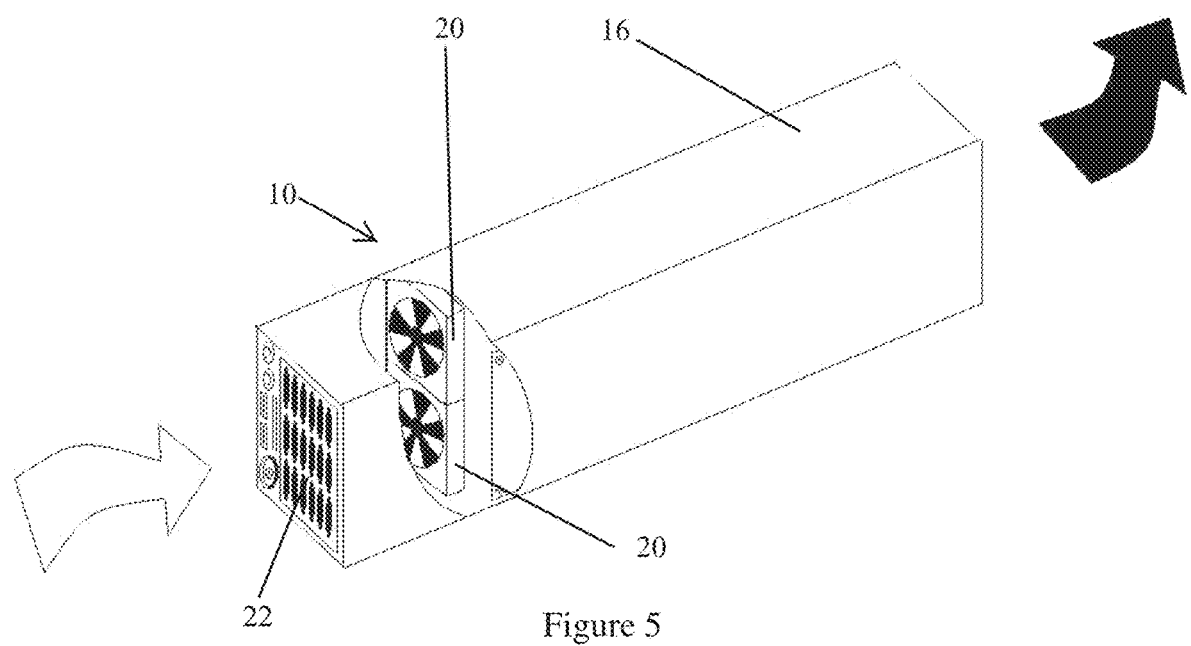
FIG. 5 is a perspective cutaway view of one embodiment of the present invention showing a computer server with a pair of fans mounted internally within the server housing or casing.
Figure 6:
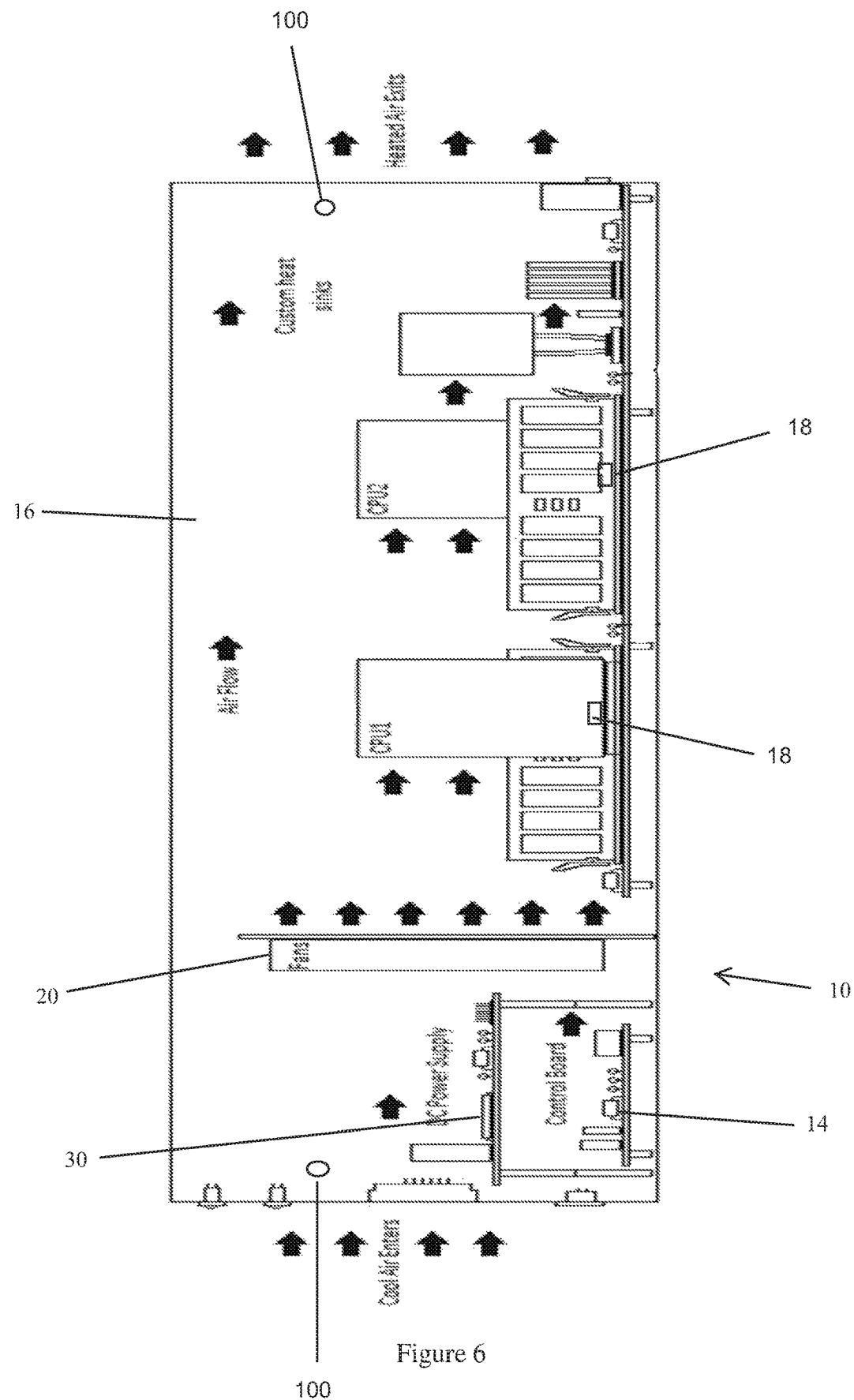
FIG. 6 is a cross sectional longitudinal view of one embodiment of the present invention showing the direction of air flow through the internal portion of the server housing or casing.

Many benefits are facilitated by the enclosure geometry, which is set forth in FIGS. 5 and 6. Unlike existing 1U and "blade" type enclosures, the generally rectangular shape of the proposed server enclosure design enables freer air flow at lower back-pressures. Since the energy required to push air through a housing 16 is proportional to the third power of the pressure, by reducing that pressure to about ¼ that of many existing designs, the present design allows fans 20 to operate with ¹⁄₆₄ of the electrical consumption of a standard server fan, increasing the power efficiency of the server-in-enclosure, and thereby generating less heat from the fan motor itself. The geometry wastes less space than larger housings, providing an optimal balance of cubic space to heat dissipation for an air-cooled design.

Figure 2:
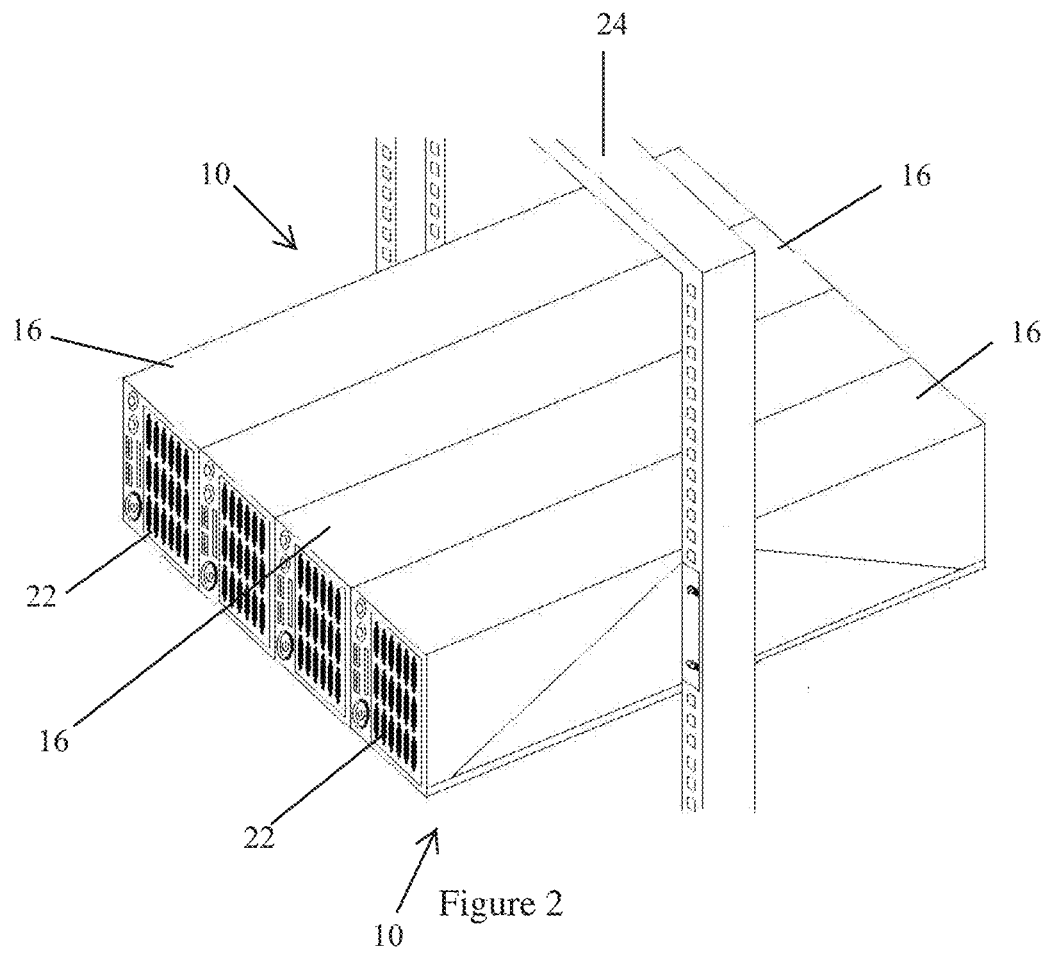
FIG. 2 is a perspective view of one embodiment of the present invention, showing four computer servers mounted on a rack.
Figure 3:
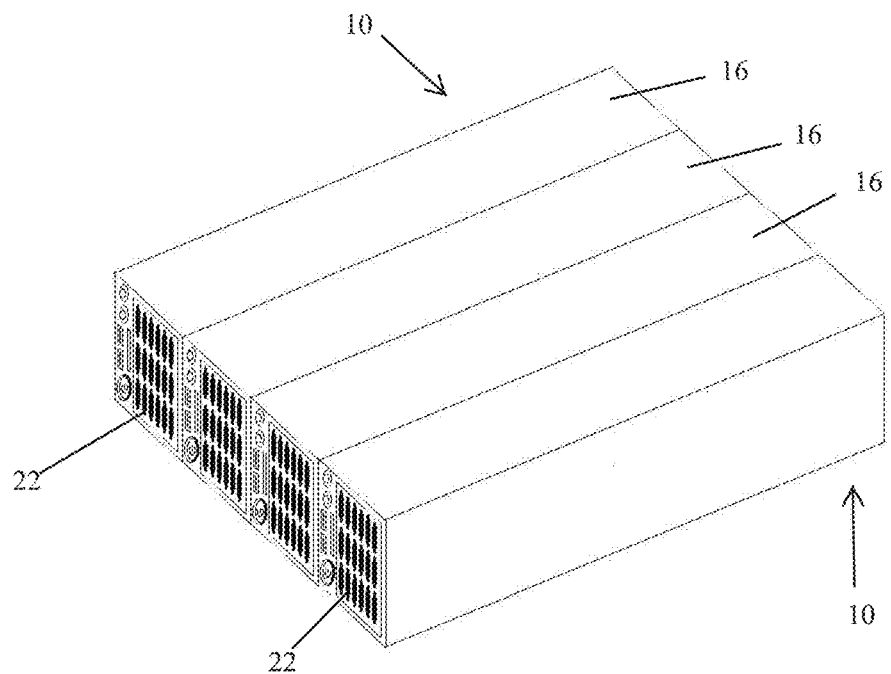
FIG. 3 is a perspective view of one embodiment of the present invention, showing a row of computer servers.
Figure 4:
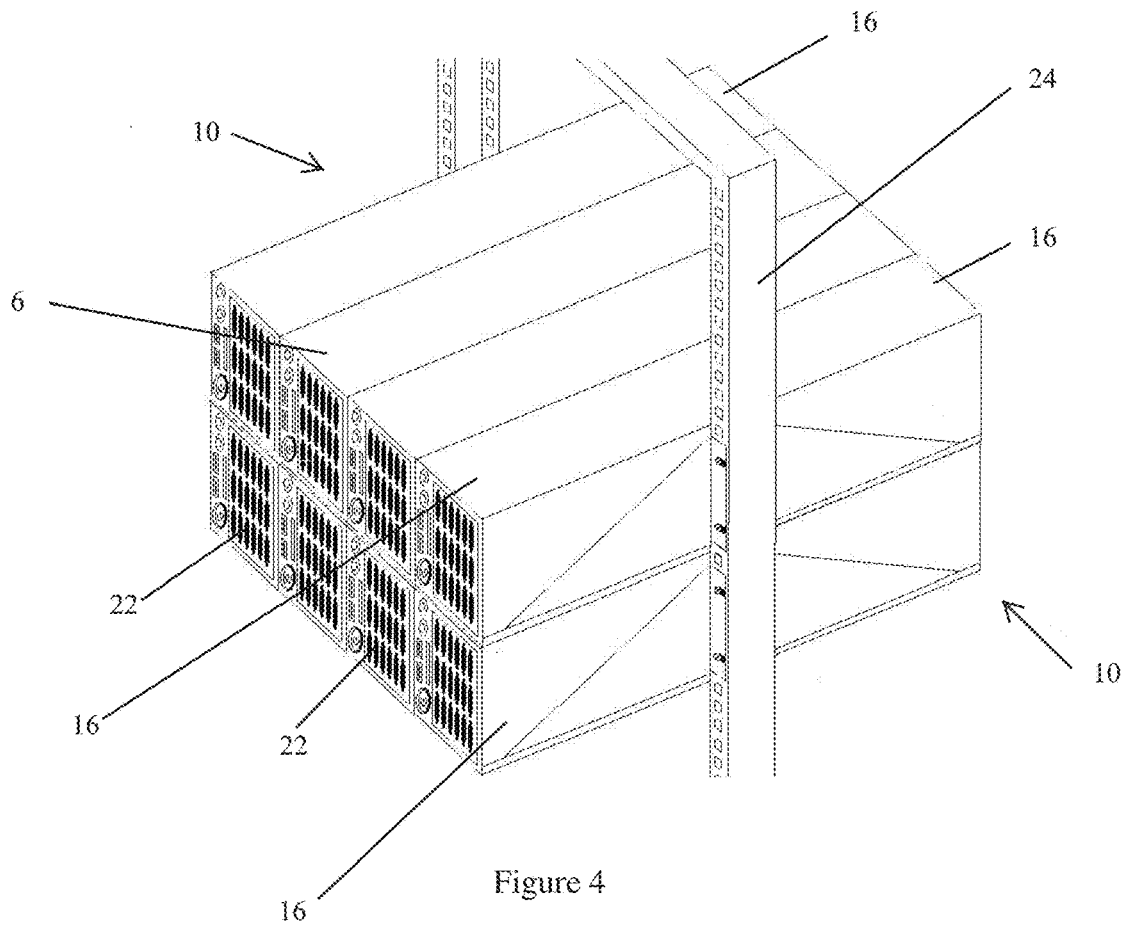
FIG. 4 is a perspective view of one embodiment of the present invention showing two rows of computer servers mounted in a rack.

Geometry options include "Single wide," "Double wide" up to full rack width modules. This design allows optimal use of rack space whether in 19", 23", or narrower or wider gauges. A full-width module is not required when the internal components do not require it. A typical server can be housed in a 4" by 7"×24" deep module. Modules are lighter and more easily handled and mounted on simple metal shelves that do not require ball-bearing slides or rear-mounts, as shown in FIGS. 2 and 4.

The increased height above the motherboard of at least 3" means more dense DRAM memory modules can be mounted, allowing about 4× the memory per module, which reduces capacitive loading that typically slows down the memory bus(es) when numerous modules are inserted.

In one embodiment, the preferred size of the computer server housing 16 has a width between about 3.5 inches to about 8 inches, and a height of between about 3.5 inches to about 7 inches. The arrangement of the fans and internal components, as shown in FIGS. 5 and 6, provides a pressure differential between entry and exit in a range of about 0 to 0.07 inches of water (air pressure measurement). The server housing 16 preferably includes vents 22 on either end thereof, for providing air flow through the housing 16, which is facilitated by the fans 20. This arrangement further provides that a difference of 10 degrees Celsius between incoming air and outgoing air may be achieved by using less than 0.1 watts of fan power per thermal watt. Additionally, the noise level is reduced by using this preferred geometry and arrangement, wherein an individual server may produce less than 50 decibels during normal operation. This is because the low-power fans do not spin as fast as fans in other server designs currently available on the market.

Heat and Humidity Sensors

The server 10 is also hardened to be able to function in high-humidity environs. The process is controlled through sensors 18 and fan control, from complete shutdown to maximum RPMs, and all points in between. The process of regulating temperature and humidity is preferably performed with a pair of 80 mm fans 20 in the current implementation for redundancy in case one fan fails, but the exact fan size is dependent upon optimal enclosure sizes and characteristics. Air flow can be stopped in high-humidity environments to allow internal self-heating for preventing condensation.

If the sensors 18 sense that the heat level is higher than it should be, then the P&CB 14 adjusts (increases) the operation of the fan accordingly. Additionally, if the humidity levels are higher than the pre-set parameters, then the system may slow the fan 20 down or cut it off in order to dissipate the humidity more quickly.

The server's two fans are controlled from the P&CB with the circuitry depicted in FIG. 10.

In one embodiment, two fans 20 are provided and are PWM controlled, and the P&CB 14 monitors and modulates their speed, and can identify a missing or non-working fan. There is a P-channel MOSFET, Q6, which can turn the fan 20 power completely OFF.

Due to being supplied by the 12V rail, the fan circuitry includes two 3 A fuses (one for each fan) which help prevent catastrophic failures if a fan or fan wires become shorted/overloaded. IC 35, a comparator, is preferably used along with some passives and semiconductors to turn the fans on in the case that the system control processor locks up and fails to provide a "heartbeat" pulse. The recommended pulse is around 0.5 to 1 ms in duration, and a period of approximately 1 second.

In one embodiment, two CPU temperature sensing inputs are provided on the P&CB 14. This arrangement is for the purpose of providing an independent temperature reading from the processor-on-motherboard reading, which is known to be highly inaccurate, with an inaccuracy sometimes even exceeding plus or minus 20 degrees C. A 10K thermistor connects to each input, and the thermistors are placed on their respective CPUs. The circuit diagram is shown in FIG. 11.

Because the thermistors don't have a linear temperature curve, a larger sensing range is provided by giving the inverting ADC inputs a reference voltage of 2.048V. This arrangement allows the full +−2.048V range of the ADC to be utilized. The minimum temperature that can be measured is approximately −20° C., and the maximum is 125° C. See Table 3 for the resistance and voltage values, at intervals of 5° C.

The two CPU temperature sensing thermistors chosen for this server have a nominal resistance of 10 kΩ at 25° C., a tolerance of 1%, and a B-curve value of 3380K. Their part number is "NXFT15XH103FA2B100".

TABLE 1

| Temp (° C.) | Resistance (kΩ) | Vout (V) | Adjusted value (V) |
|---|---|---|---|
| −40 | 197.388 | 4.597 | 2.549 |
| −35 | 149.395 | 4.482 | 2.434 |
| −30 | 114.345 | 4.345 | 2.297 |
| −25 | 88.391 | 4.185 | 2.137 |
| −20 | 68.915 | 4.004 | 1.956 |
| −15 | 54.166 | 3.801 | 1.753 |
| −10 | 42.889 | 3.580 | 1.532 |
| −5 | 34.196 | 3.346 | 1.298 |
| 0 | 27.445 | 3.102 | 1.054 |
| 5 | 22.165 | 2.855 | 0.807 |
| 10 | 18.010 | 2.611 | 0.563 |
| 15 | 14.720 | 2.373 | 0.325 |
| 20 | 12.099 | 2.147 | 0.099 |
| 25 | 10.000 | 1.825 | −0.223 |
| 30 | 8.309 | 1.743 | −0.305 |
| 35 | 6.939 | 1.567 | −0.481 |
| 40 | 5.824 | 1.409 | −0.639 |
| 45 | 4.922 | 1.270 | −0.778 |
| 50 | 4.160 | 1.144 | −0.904 |
| 55 | 3.539 | 1.034 | −1.014 |
| 60 | 3.024 | 0.939 | −1.109 |
| 65 | 2.593 | 0.856 | −1.192 |
| 70 | 2.233 | 0.783 | −1.265 |
| 75 | 1.929 | 0.720 | −1.328 |
| 80 | 1.673 | 0.666 | −1.382 |
| 85 | 1.455 | 0.618 | −1.430 |
| 90 | 1.270 | 0.577 | −1.471 |
| 95 | 1.112 | 0.541 | −1.507 |
| 100 | 0.976 | 0.510 | −1.538 |
| 105 | 0.860 | 0.483 | −1.565 |
| 110 | 0.759 | 0.459 | −1.589 |
| 115 | 0.673 | 0.439 | −1.609 |
| 120 | 0.598 | 0.421 | −1.627 |
| 125 | 0.532 | 0.405 | −1.643 |

The thermistor beads have a diameter of 1.2±0.4 mm, upon which a protective sleeve of heatshrink tubing is placed. This heatshrink tubing shall have a supplied ID (Inner Diameter) of 0.063".

Figure 7:
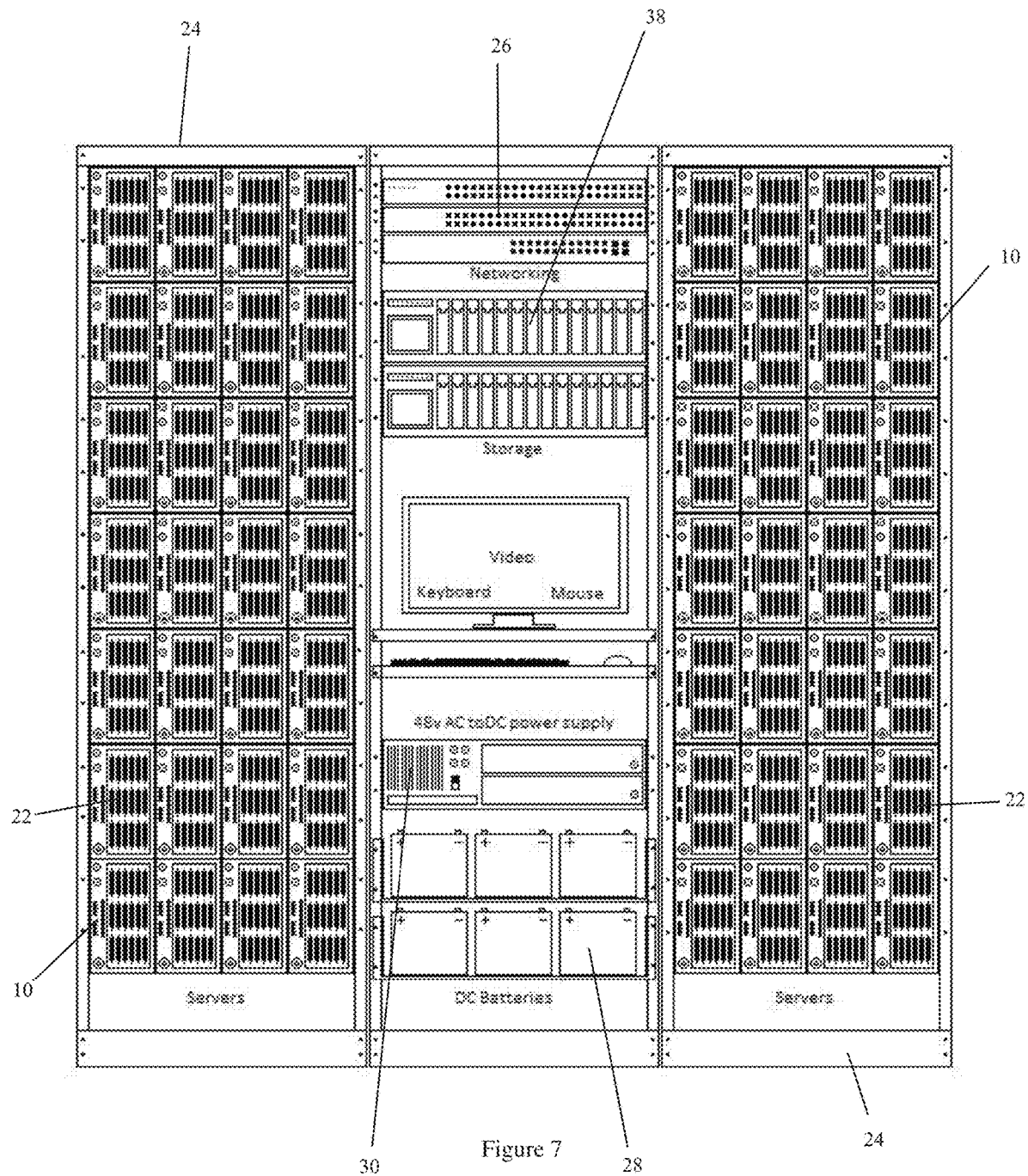
FIG. 7 is a front view of one embodiment of the present invention, showing a rack having computer servers mounted within the rack, and further showing networking components, storage components, a workstation including a monitor, keyboard and mouse, and further showing a power supply along with a series of DC batteries.

A server rack 24 may be used, as shown in FIG. 7, wherein a series of servers 10 are positioned on the rack 24 and are operationally connected to networking components 26, a series of DC batteries 28, a 48 v AC to DC power supply, a video screen 32, keyboard 34 and mouse 36, and storage components 38.

Although the present invention has been described in considerable detail with reference to certain preferred versions thereof, other versions are possible. Therefore, the spirit and scope of the appended claims should not be limited to the description of the preferred versions contained herein. All features disclosed in this specification may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A computer server comprising:
   a housing defining a space within said housing for placement of electronic components;
   a power and control board positioned within said housing, wherein said power and control board receives an unregulated 48 volt electrical current and converts said electrical current to lower voltages for use by other electronic components;
   a motherboard positioned within said h g, said motherboard being operationally connected to said power and control board so that said power and control board controls said electrical voltage that is supplied to said motherboard;
   at least one fan positioned within said housing, wherein said fan is used to provide air flow within said housing in order to control temperature and humidity;
   at least one temperature sensor and one humidity sensor positioned within said housing, wherein said temperature sensor and humidity sensor are operationally connected to said power and control board, and wherein said power and control board is operationally connected to said fan, so that said power and control board operates said fan based on input received from said temperature and humidity sensors; and
   wherein said power and control board is programmed to slow down or cut off said fan when humidity levels are detected above a pre-set parameter by said humidity sensor, in order to reduce condensation and dissipate humidity in a higher temperature environment within said housing.

2. The computer server set forth in claim 1, wherein said housing has a height in the range of 3.5 inches to 8 inches, and further has a width in the range of 3.5 inches to 7 inches.

3. The computer server set forth in claim 1, further including a second fan, wherein both said fans are independently controlled by said power and control hoard so that a failure, of one fan is detected by said power and control board, and in response, said power and control board may increase the speed or time of use of the other fan.

4. The computer server set forth in claim 1, wherein said fan is an 80 mm fan.

5. The computer server set forth in claim 1, wherein said fan is controlled from the power and control board using pulse width modulation signals.

6. A computer server comprising:
- a housing defining a space within said housing for placement of electronic components;
- a power and control board positioned within said housing, wherein said power and control board receives a DC electrical current at a first voltage and converts said electrical current to lower voltages for use by other electronic components;
- a motherboard positioned within said housing, said motherboard being operationally connected to said power and control board so that said power and control board controls said electrical voltage that is supplied to said motherboard;
- at least one fan positioned within said housing, wherein said fan is used to provide air flow within said housing in order to control temperature humidity;
- at least one temperature sensor and one humidity sensor positioned within said housing, wherein said temperature sensor and humidity sensor are operationally connected to said power and control board, and wherein said power and control board is operationally connected to said fan, so that said power and control board operates said fan based on input received from said temperature and humidity sensors; and
- wherein said power and control board is programmed to slow down or cut off said fan when humidity levels are detected above a pre-set parameter by said humidity sensor, in order to reduce condensation and dissipate humidity in a higher temperature environment within said housing.

7. The computer server set forth in claim 6, wherein said first current is unregulated 48 volt electrical current.

8. The computer server set forth in claim 6, wherein said housing has a height in the range of 3.5 inches to 8 inches, and further has a width in the range of 3.5 inches to 7 inches.

9. The computer server set forth in claim 6, further including a second fan, wherein both said fans are independently controlled by said power and control hoard so that a failure of one fan is detected by said power and control board, and in response, said power and control board may increase the speed or time of use of the other fan.

10. The computer server set forth in claim 6, wherein said fan is an 80 mm fan.

11. The computer server set forth in claim 6, wherein said fan is controlled from the power and control hoard using pulse width modulation signals.

* * * * *

UNITED STATES PATENT AND TRADEMARK OFFICE
CERTIFICATE OF CORRECTION

Page 1 of 1

PATENT NO. : 10,897,839 B2
APPLICATION NO. : 15/935825
DATED : January 19, 2021
INVENTOR(S) : Bernardin et al.

It is certified that error appears in the above-identified patent and that said Letters Patent is hereby corrected as shown below:

In the Claims

In Column 12 on Line 41 (Claim 1, Line 9), the term "h g" should be changed to --"housing"--.

Signed and Sealed this
Ninth Day of March, 2021

Drew Hirshfeld
*Performing the Functions and Duties of the*
*Under Secretary of Commerce for Intellectual Property and*
*Director of the United States Patent and Trademark Office*